US006214923B1

(12) United States Patent
Goto et al.

(10) Patent No.: US 6,214,923 B1
(45) Date of Patent: Apr. 10, 2001

(54) POLYIMIDE-BASED COMPOSITE, ELECTRONIC PARTS USING THE COMPOSITE, AND POLYIMIDE-BASED AQUEOUS DISPERSION

(75) Inventors: Hirofumi Goto; Takako Yamada; Nobuyuki Ito, all of Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/356,323

(22) Filed: Jul. 16, 1999

(30) Foreign Application Priority Data

Jul. 17, 1998 (JP) .................................................. 10-202503
Aug. 3, 1998 (JP) .................................................. 10-219025

(51) Int. Cl.[7] ...................................................... C08L 77/00
(52) U.S. Cl. .......................... 524/514; 524/506; 524/507; 525/180; 525/183; 428/473.5
(58) Field of Search ................................... 525/180, 183; 524/506, 507, 514; 428/473.5

(56) References Cited

U.S. PATENT DOCUMENTS 5,462,996    10/1995    Portelli et al. ........................ 525/423
5,972,807    10/1999    Tani et al. .............................. 442/63

FOREIGN PATENT DOCUMENTS 9-104839     4/1997    (JP) .
9-124978     5/1997    (JP) .
10-36668     2/1998    (JP) .
WO 90/09410  8/1990    (WO) .

*Primary Examiner*—Ana Woodward
(74) *Attorney, Agent, or Firm*—Oblon, Spivak, McClelland, Maier & Neustadt, P.C.

(57) ABSTRACT

A polyimide-based composite according to the invention is formed using a precursor comprising (A) a polyimide component and (B) another polymer component, wherein the polyimide forms a continuous phase and the other polymer forms a discontinuous phase, and the elastic modulus is less than 10 GPa. This structure provides both the properties of insulation, etc. contributed by the polyimide and the properties of low elastic modulus and satisfactory adhesion, moldability, etc. contributed by the other polymer. The polyimlde-based aqueous dispersion of the invention has dispersed therein particles with a mean particle size of 0.03–5 μm comprising the precursor of the polyimide-based composite, the dispersed particles including in the same particles the (A) polyimide component and (B) other polymer component comprising a hydrophilic polymer. This gives satisfactory storage stability to the aqueous dispersion.

17 Claims, 1 Drawing Sheet

POLYIMIDE-BASED COMPOSITE, ELECTRONIC PARTS USING THE COMPOSITE, AND POLYIMIDE-BASED AQUEOUS DISPERSION

BACKGROUND OF THE INVENTION

The present invention relates to a polyimide-based composite formed using a precursor comprising a polyimide component and another polymer component, to electronic parts employing the polyimide-based composite and to a polyimide-based aqueous dispersion prepared by dispersing a precursor comprising a polyimide component and another polymer component in an aqueous medium.

1. Prior Art

Metal-clad laminates, which are prepared by impregnating a substrate such as glass fibers with a thermosetting resin solution and then laminating a prescribed number thereof which have been dried (prepregs), attaching copper foil or the like to one or both sides thereof and using heat contact bonding to harden the thermosetting resin, are used in printed wiring boards for industrial electronic instruments, OA devices, electrical appliances for public use, etc., and demand therefor has been increasing. In recent years, the trend toward smaller, lighter and more highly integrated electrical and electronic parts has accelerated efforts for greater stratification and higher density, and a strong demand has emerged for improvements in the adhesion, heat resistance and electrical properties of resin materials and the like used for such parts.

2. Problems to be Solved by the Invention

The most widely used thermosetting resins for electronic parts in the past have been epoxy resins which are mainly of the bisphenol A type. However, while such epoxy resins are superior in terms of the solubility of their uncured compositions in various solvents, their post-molding adhesion with metals such as copper foil and their chemical resistanc, heat resistance and electrical properties have been inadequate. In particular, the notable reduction in electrical properties after moist heat resistance testing has been an obstacle to their application for more highly integrated parts.

The use of polyimide resins has therefore been attempted in an effort to improve heat resistance.

Polyimide resins obtained by reaction between tetracarboxylic acid anhydrides and diamines have excellent electrical insulating properties, solvent resistance and mechanical properties and are used in many different fields including electric and electronic materials, aerospace technology, etc. However, in addition to problems such as poor solubility of their uncured forms in organic solvents making their impregnation into substrates difficult and the requirement for heat treatment at high temperature for curing reaction, they have generally been associated with other problems including low adhesion with various substrates, low water resistance and the tendency to cause deformation when coated onto metal thin films, because of the differences in thermal expansion coefficients.

On the other hand, with the recent downsizing and thickness and weight reduction of electrical products in recent years, there has been an increase in the use of flexible printed boards having metal foils attached to one or both sides of film-like resins, and metal-clad laminates (film laminates) for multilayer printed boards. There has also been an increased demand for electronic parts with resin layers formed using film-like resins. Currently, polyimide resins and polyester resins are primarily used as film-like resins. However, when a polyimide resin is used it is necessary to employ an adhesive at the interface with the copper foil, while polyester resins do not provide adequate heat resistance.

Moreover, increasing social awareness recently with regard to environmental safety in particular is creating a need to switch the media used from organic solvent systems to aqueous systems in the field of electronic materials as well. Yet, when it is attempted to supply a polyimide-based material with an aqueous medium the poor solubility of the polyimide in the aqueous medium makes it necessary to provide an aqueous dispersion form where the polyimide is dispersed in the aqueous medium. However, it has been very difficult to ensure sufficient storage stability for conventional polyimide-based aqueous dispersions.

SUMMARY OF THE INVENTION

Object of the Invention

It is an object of the present invention to provide a polyimide-based composite that can be suitably used for electronic parts and the like, possessing the original heat-resistant, electrical insulating and mechanical properties of a polyimide as well as excellent adhesion and water resistance, and electronic parts which employ the composite.

It is another object of the invention to provide a polyimide-based aqueous dispersion with excellent storage stability and electrodeposition properties, in which there is dispersed a precursor that forms a polyimide-based composite possessing the original heat-resistant, electrical insulating and mechanical properties of the polyimide.

Features of the Invention

According to the invention, the aforementioned objects of the invention are achieved by providing the following polyimide-based composites, electronic parts and polyimide-based aqueous dispersions.

[1] A polyimide-based composite formed using a precursor comprising (A) a polyimide component and (B) another polymer component, the polyimide-based composite being characterized in that in the composite the polyimide forms a continuous phase and the other polymer forms a discontinuous phase, and the elastic modulus of the composite is less than 10 GPa.

[2] A polyimide-based composite according to [1] above, wherein the number-mean particle size of the discontinuous phase is in the range of 0.01–0.9 $\mu$m.

[3] A polyimide-based composite according to [1] above, wherein the glass transition temperature of the other polymer is in the range of –200° C. to 120° C.

[4] A polyimide-based composite according to [1] above, wherein the amount of the (A) polyimide component used is at least 5 wt % and less than 50 wt % with respect to the total amount of the polyimide-based composite.

[5] A polyimide-based composite according to [1] above, wherein the (A) polyimide component is at least one type selected from among polyimide-based polymers and polyamic acid, the (B) other polymer component comprises an elastic polymer with a reactive group and an elastic modulus of 0.0001–0.5 GPa, and the precursor is obtained by reacting the (A) polyimide component and the (B) other polymer component.

[6] A polyimide-based composite according to [1] above, which is formed using a polyimide-based aqueous dispersion obtained by dispersing the precursor in particle form in an aqueous medium.

[7] A polyimide-based composite according to [1] above, which is formed using an organic solvent solution of the precursor.

[8] A polyimide-based composite according to [1] above, wherein the (B) other polymer component is (B-1) a cationic polymer component, and which is formed using a polyimide-based aqueous dispersion obtained by dispersing the precursor in particle form in an aqueous medium in the presence of a polyacid.

[9] A polyimide-based composite according to [1] above, wherein the (B) other polymer component is (B-2) an anionic polymer component, and which is formed using a polyimide-based aqueous dispersion obtained by dispersing the precursor in particle form in an aqueous medium in the presence of a polyamine.

[10] A polyimide-based composite according to [1] above which forms a film.

[11] A polyimide-based composite according to [10] above, which is formed by electrodeposition of the precursor.

[12] An electronic part having a layer comprising a polyimide-based composite according to [1] above.

[13] A polyimide-based aqueous dispersion prepared by dispersing in particle form in an aqueous medium a precursor which forms a polyimide-based composite, the polyimide-based aqueous dispersion being characterized in that the particles of the precursor include in the same particles (A) a polyimide component and (B) another polymer component composed of a hydrophilic polymer, and have a mean particle size of 0.03–5 $\mu$m.

[14] A polyimide-based aqueous dispersion according to [13] above, wherein the (B) other polymer component is (B-1) a cationic polymer component, and the dispersion of the precursor in the aqueous medium is accomplished in the presence of a polyacid.

[15] A polyimide-based aqueous dispersion according to [13] above, wherein the (B) other polymer component is (B-2) an anionic polymer component, and the dispersion of the precursor in the aqueous medium is accomplished in the presence of a polyamine.

[16] A polyimide-based aqueous dispersion according to any one of [13] to [15] above which is used in a surface treatment solution.

[17] A polyimide-based aqueous dispersion according to any one of [13] to [15] above which is used for electrodeposition.

Function

In the polyimide-based composite of the invention, the polyimide forms a continuous phase and the other polymer is surrounded by the polyimide continuous phase and forms a discontinuous phase. By having this type of structure, the polyimide-based composite of the invention has a high level balance between the properties of insulation, etc. contributed by the polyimide and the properties of low elastic modulus and satisfactory adhesion and moldability contributed by the other polymer, so that the object of the present invention can thus be achieved.

Having such properties, the polyimide-based composite of the invention is therefore suitable as a structural material for resin layers used in electronic parts.

Furthermore, in the polyimide-based aqueous dispersion of the invention the (B) other polymer component composed of a hydrophilic polymer is copresent with the (A) polyimide component in the same precursor particles, preferably bonded with the (A) polyimide component. The dispersion stability of the precursor particles is therefore higher, and the storage stability of the aqueous dispersion is satisfactory.

Effect of the Invention

The polyimide-based composite of the invention has excellent transparency, water resistance, moist heat resistance, adhesion to various substrates, heat deformation resistance, etc., without loss of the original heat-resistant, electrical insulating and mechanical properties of the polyimide.

Consequently, a polyimide-based composite of the invention can be very suitably used as a protective film, electrical insulating film, insulating adhesive layer, etc. for an electrical instrument, electronic part or the like, and is also useful for adhesives, paints, thermosetting films, cured films, prepregs, cured molded products, metal-clad laminates, etc.

A metal-clad laminate according to the invention and a printed wiring board employing it has excellent heat resistance, adhesion, water resistance, electrical insulation and chemical resistance, and is therefore applicable for downsizing, weight reduction and higher integration of electrical and electronic parts.

A polyimide-based aqueous dispersion according to the invention has very good storage stability compared to conventional aqueous dispersions. Such an aqueous dispersion can form polyimide-based composites with excellent transparency, water resistance, moist heat resistance, adhesion to various substrates, heat deformation resistance, etc., without loss of the original heat-resistant, electrical insulating and mechanical properties of the polyimide.

DETAILED DESCRIPTION OF THE INVENTION

Figure 1:
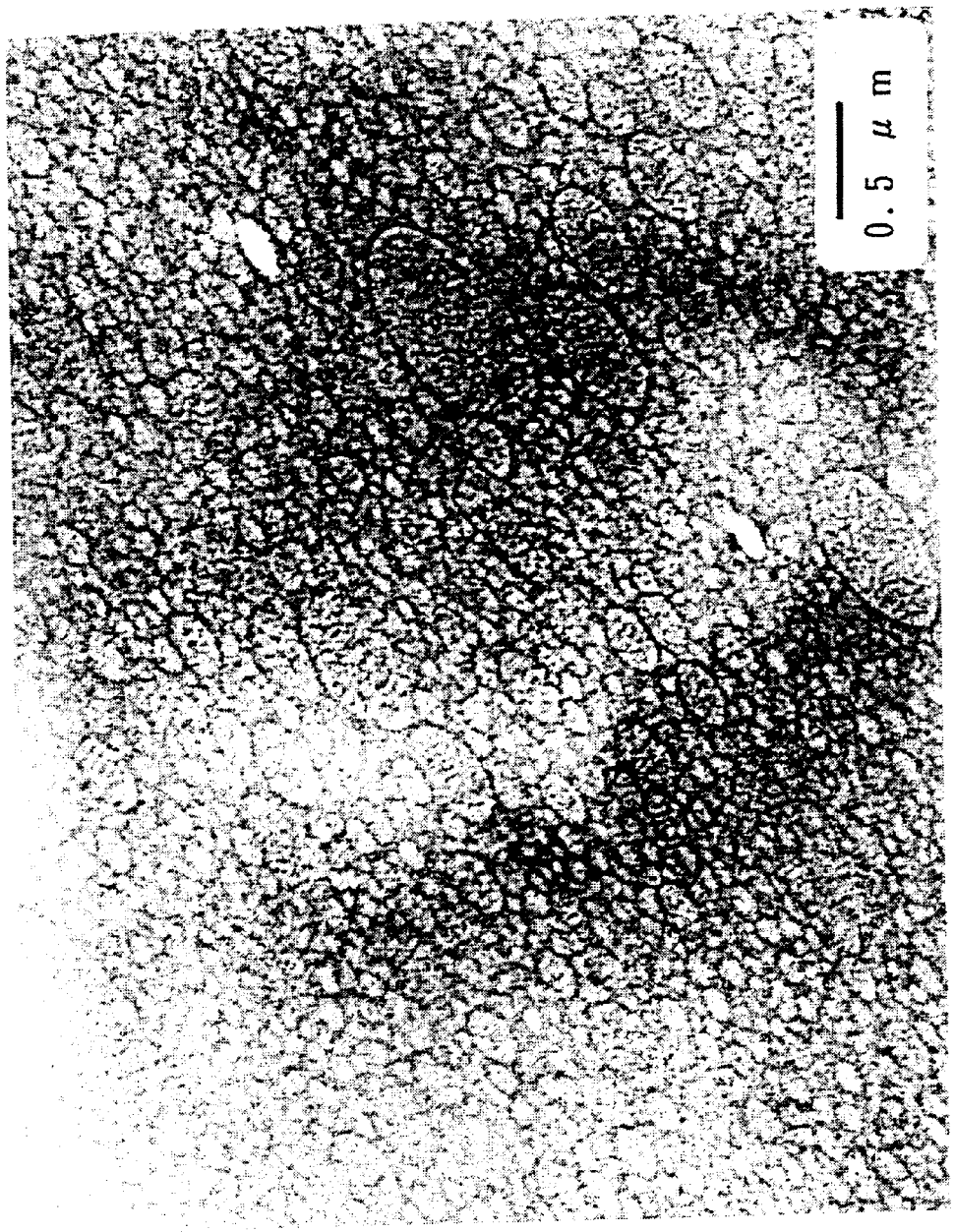
FIG. 1 is an electron micrograph of a film cross-section of a polyimide-based composite fabricated according to Example 3.

The present invention will now be explained in further detail.

(A) Polyimide Component

According to the invention, the concept of the (A) polyimide component includes, in addition to polyimides, also components that are converted to polyimides in the process of preparing the polyimide-based composite of the invention.

A polyimide can typically be synthesized by mixing a tetracarboxylic dianhydride and a diamine compound in an organic polar solvent for polycondensation to obtain a polyamic acid, and then subjecting the polyamic acid to dehydrating ring closure by heat imidation or chemical imidation.

Thus, polyamic acids which are polyimide intermediates are also included by the (A) polyimide component. In addition, polyimides with a block structure synthesized by multistage polycondensation of a tetracarboxylic dianhydride and a diamine compound can also be suitably used for the (A) polyimide component of the invention.

The (A) polyimide component is preferably soluble in organic solvents.

According to the invention, the "precursor" comprising the (A) component and (B) component is a compound which forms a polyimide-based composite upon curing by heat treatment or the like (i.e., an uncured or semi-cured polyimide-based composite).

<Tetracarboxylic dianhydride>

(A) The tetracarboxylic dianhydride used for production of the (A) polyimide component is not particularly restricted, and as concrete examples thereof there may be mentioned: butane tetracarboxylic dianhydride, 1,2,3,4-cyclobutane tetracarboxylic dianhydride, 1,2-dimethyl-1,2,3,4-cyclobutane tetracarboxylic dianhydride, 1,3-dimethyl-1,2,3,4-cyclobutane tetracarboxylic dianhydride, 1,3-dichloro-1,2,3,4-cyclobutane tetracarboxylic dianhydride, 1,2,3,4-tetramethyl-1,2,3,4-cyclobutane tetracarboxylic dianhydride, 1,2,3,4-cyclopentane tetracarboxylic dianhydride, 1,2,4,5-cyclohexane tetracarboxylic dianhydride, 3,3',4,4'-dicyclohexyl tetracarboxylic dianhydride, 2,3,5-tricarboxycyclopentyl acetic dianhydride, 3,5,6-tricarboxynorbornane-2-acetic dianhydride, 2,3,4,5-tetrahydrofuran tetracarboxylic dianhydride, 1,3,3a,4,5,9b-hexahydro-5-(tetrahydro-2,5-dioxo-3-furanyl)-naphtho[1,2-c]-furan-1,3-dione, 1,3,3a,4,5,9b-hexahydro-5-methyl-5-(tetrahydro-2,5-dioxo-3-furanyl)-naphtho[1,2-c]-furan-1,3-dione, 1,3,3a,4,5,9b-hexahydro-5-ethyl-5-(tetrahydro-2,5-dioxo-3-furanyl)-naphtho[1,2-c]-furan-1,3-dione, 1,3,3a,4,5,9b-hexahydro-7-methyl-5-(tetrahydro-2,5-dioxo-3-furanyl)-naphtho[1,2-c]-furan-1,3-dione, 1,3,3a,4,5,9b-hexahydro-7-ethyl-5-(tetrahydro-2,5-dioxo-3-furanyl)-naphtho[1,2-c]-furan-1,3-dione, 1,3,3a,4,5,9b-hexahydro-8-methyl-5-(tetrahydro-2,5-dioxo-3-furanyl)-naphtho[1,2-c]-furan-1,3-dione, 1,3,3a,4,5,9b-hexahydro-8-ethyl-5-(tetrahydro-2,5-dioxo-3-furanyl)-naphtho[1,2-c]-furan-1,3-dione, 1,3,3a,4,5,9b-hexahydro-5,8-dimethyl-5-(tetrahydro-2,5-dioxo-3-furanyl)-naphtho[1,2-c]-furan-1,3-dione, 5-(2,5-dioxotetrahydrofural)-3-methyl-3-cyclohexene-1,2-dicarboxylic dianhydride, bicylo[2.2.2]-octo-7-ene-2,3,5,6-tetracarboxylic dianhydride, and aliphatic tetracarboxylic dianhydrides and alicyclic tetracarboxylic dianhydrides such as compounds represented by the following formulas (1) and (2):

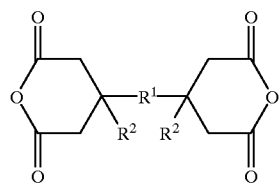

(1)

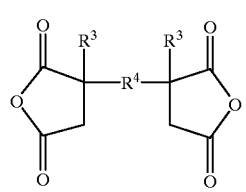

(2)

wherein $R^1$ and $R^3$ represent divalent organic groups with aromatic rings and $R^2$ and $R^4$ are the same or different and represent hydrogen atoms or alkyl groups; pyromellitic dianhydride, 3,3',4,4'-benzophenone tetracarboxylic dianhydride, 3,3',4,4'-biphenylsulfone tetracarboxylic dianhydride, 1,4,5,8-naphthalene tetracarboxylic dianhydride, 2,3,6,7-naphthalene tetracarboxylic dianhydride, 3,3',4,4'-biphenylether tetracarboxylic dianhydride, 3,3',4,4'-dimethyldiphenylsilane tetracarboxylic dianhydride, 3,3',4,4'-tetraphenylsilane tetracarboxylic dianhydride, 1,2,3,4-furan tetracarboxylic dianhydride, 4,4'-bis(3,4-dicarboxyphenoxy)diphenylsulfide dianhydride, 4,4'-bis(3,4-dicarboxyphenoxy)diphenylsulfone dianhydride, 4,4'-bis(3,4-dicarboxyphenoxy)diphenylpropane dianhydride, 3,3',4,4'-perfluoroisopropylidene diphthalic dianhydride, 3,3',4,4'-biphenyl tetracarboxylic dianhydride, bis(phthalic) phenylphosphine oxide dianhydride, p-phenylene-bis(triphenylphthalic) dianhydride, m-phenylene-bis(triphenylphthalic) dianhydride, bis(triphenylphthalic)-4,4'-diphenylether dianhydride, bis(triphenylphthalic)-4,4'-diphenylmethane dianhydride, ethyleneglycol-bis(anhydrotrimellitate), propyleneglycol-bis(anhydrotrimellitate), 1,4-butanediol-bis(anhydrotrimellitate), 1,6-hexanediol-bis(anhydrotrimellitate), 1,8-octanediol-bis(anhydrotrimellitate), 2,2-bis(4-hydroxyphenyl)propane-bis(anhydrotrimellitate), and aromatic tetracarboxylic dianhydrides such as compounds represented by the following formulas (3) to (6).

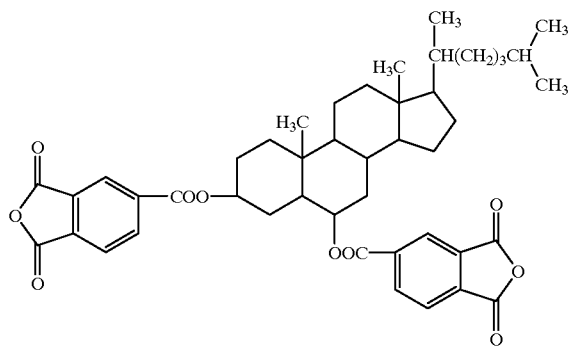

(3)

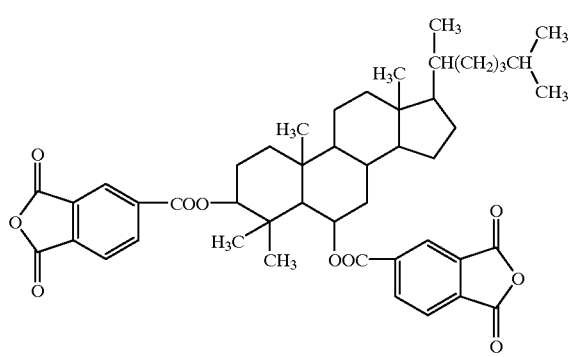

(4)

-continued

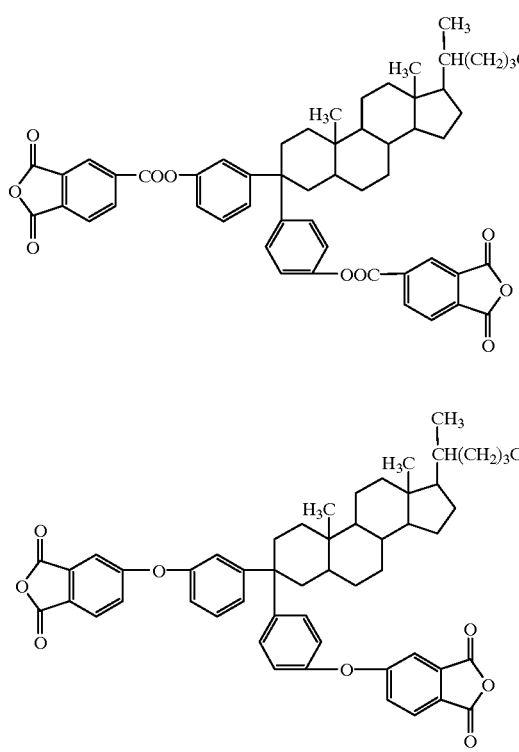

These tetracarboxylic dianhydrides may be used alone or in combinations of two or more.

<Diamine compound>

As examples of diamine compounds to be used for production of the (A) polyimide component there may be mentioned: aromatic diamines such as p-phenylenediamine, m-phenylenediamine, 4,4'-diaminodiphenylmethane, 4,4'-diaminodiphenylethane, 4,4'-diaminodiphenylsulfide, 4,4'-diaminodiphenylsulfone, 3,3'-dimethyl-4,4'-diaminobiphenyl, 4,4'-diaminobenzanilide, 4,4'-diaminodiphenylether, 1,5-diaminonaphthalene, 3,3'-dimethyl-4,4'-diaminobiphenyl, 5-amino-1-(4'-aminophenyl)-1,3,3-trimethylindane, 6-amino-1-(4'-aminophenyl)-1,3,3-trimethylindane, 3,4'-diaminodiphenylether, 3,3'-diaminobenzophenone, 3,4'-diaminobenzophenone, 4,4'-diaminobenzophenone, 2,2-bis[4-(4-aminophenoxy)phenyl] propane, 2,2-bis[4-(4-aminophenoxy)phenyl] hexafluoropropane, 2,2-bis(4-aminophenyl) hexafluoropropane, 2,2-bis[4-(4-aminophenoxy)phenyl] sulfone, 1,4-bis(4-aminophenoxy) benzene, 1,3-bis(4-aminophenoxy) benzene, 1,3-bis(3-aminophenoxy) benzene, 9,9-bis(4-aminophenyl)-10-hydroanthracene, 2,7-diaminofluorene, 9,9-bis(4-aminophenyl) fluorene, 4,4'-methylene-bis(2-chloroaniline), 2,2',5,5'-tetrachloro-4,4'-diaminobiphenyl, 2,2'-dichloro-4,4'-diamino-5,5'-dimethoxybiphenyl, 3,3'-dimethoxy-4,4'-diaminobiphenyl, 4,4'-(p-phenyleneisopropylidene) bisaniline, 4,4'-(m-phenyleneisopropylidene) bisaniline, 2,2'-bis[4-(4-amino-2-trifluoromethylphenoxy)phenyl] hexafluoropropane, 4,4'-diamino-2,2'-bis(trifluoromethyl) biphenyl and 4,4'-bis[(4-amino-2-trifluoromethyl)phenoxy]-octafluorobiphenyl; aliphatic or alicyclic diamines such as 1,1-metaxylylenediamline, 1,3-propanediamine, tetramethylenediamine, pentamethylenediamine, hexamethylenediamine, heptamethylenediamine, octamethylenediamine, nonamethylenediamine, 4,4-diaminoheptamethylenediamine, 1,4-diaminocyclohexane, isophoronediamine, tetrahydrodicyclopentadienylenediamine, hexahydro-4,7-methanoindanylenedimethylenediamine, tricyclo[6.2.1.0$^{2,7}$]-undecylenedimethyldiamine and 4,4'-methylenebis(cyclohexylamine); diamines having in the molecule two primary amino groups and a nitrogen atom outside of the amino groups, such as 2,3-diaminopyridine, 2,6-diaminopyridine, 3,4-diaminopyridine, 2,4-diaminopyrimidine, 5,6-diamino-2,3-dicyanopyrazine, 5,6-diamino-2,4-dihydroxypyrimidine, 2,4-diamino-6-dimethylamino-1,3,5-triazine, 1,4-bis(3-aminopropyl) piperazine, 2,4-diamino-6-isopropoxy-1,3,5-triazine, 2,4-diamino-6-methoxy-1,3,5-triazine, 2,4-diamino-6-phenyl-1,3,5-triazine, 2,4-diamino-6-methyl-1,3,5-triazine, 2,4-diamino-1,3,5-triazine, 4,6-diamino-2-vinyl-1,3,5-triazine, 2,4-diamino-5-phenylthiazole, 2,6-diaminopurine, 5,6-diamino-1,3-dimethyluracil, 3,5-diamino-1,2,4-triazole, 6,9-diamino-2-ethoxyacridine lactate, 3,8-diamino-6-phenylphenanthridine, 1,4-diaminopiperazine, 3,6-diaminoacridine, bis(4-aminophenyl)phenylamine, and compounds represented by the following formulas (7) and (8):

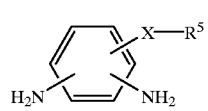

(7)

wherein R$^5$ represents a monovalent organic group derived from a compound with a nitrogen-containing ring structure selected from the group consisting of pyridine, pyrimidine, triazine, piperidine and piperazine, and X represents a divalent organic group;

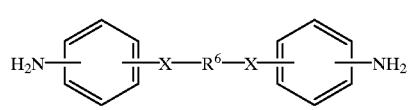

(8)

wherein R$^6$ represents a divalent organic group derived from a compound with a nitrogen-containing ring structure selected from the group consisting of pyridine, pyrimidine, triazine, piperidine and piperazine, and X represents the same or a different divalent organic group; and monosubstituted phenylenediamines represented by the following formula (9):

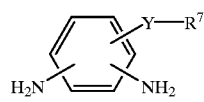

(9)

wherein Y represents —O—, —COO—, —OCO—, —NHCO—, —CONH— or —CO—, and R$^7$ represents a hydrogen atom, a fluorine atom, a trifluoromethyl group, an alkyl group of 6–30 carbon atoms or a monovalent group with a steroid skeleton; diaminoorganosiloxanes represented by the following formula (10):

(10)
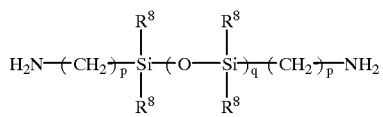
wherein $R^8$ represents the same or different hydrocarbon groups of 1–12 carbon atoms, p is an integer of 1–3 and q is an integer of 1–20; and compounds represented by the following formulas (11)–(23).
These diamine compounds may be used alone or in combinations of two or more.
(11)
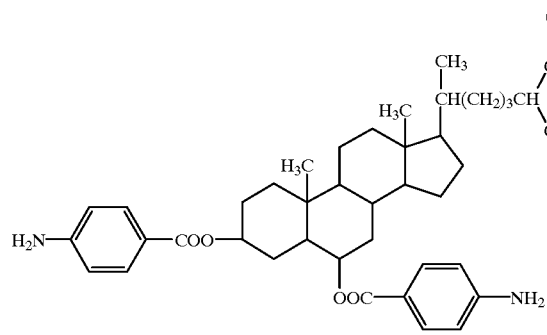
(12)
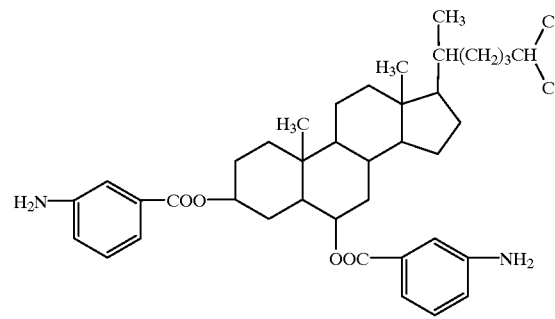
(13)
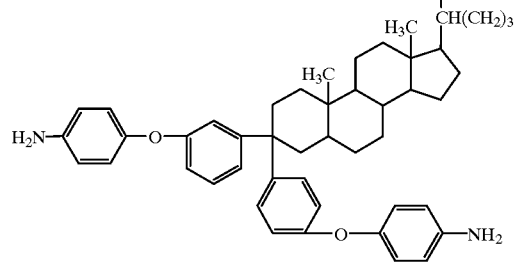
(14)
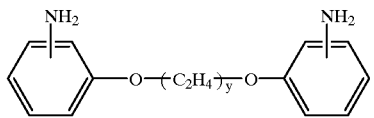
(15)
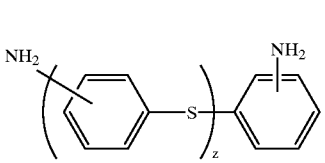
wherein y is an integer of 2–12 and z is an integer of 1–5.
(16)
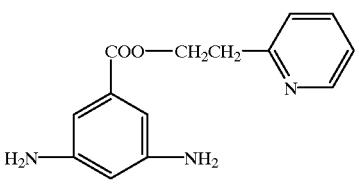
(17)
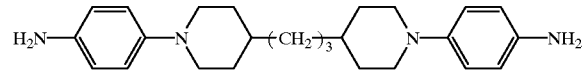
(18)
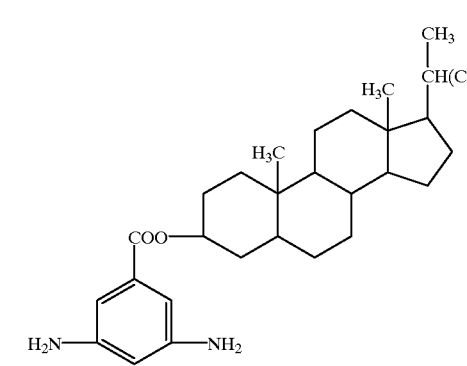
(19)
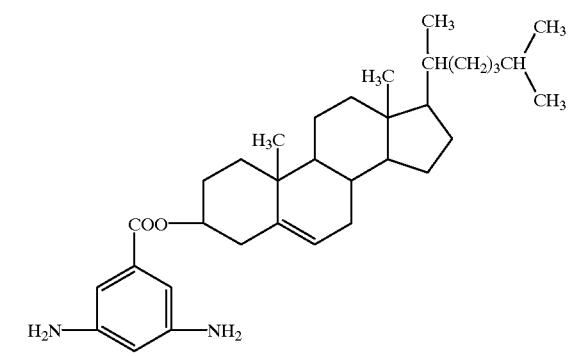

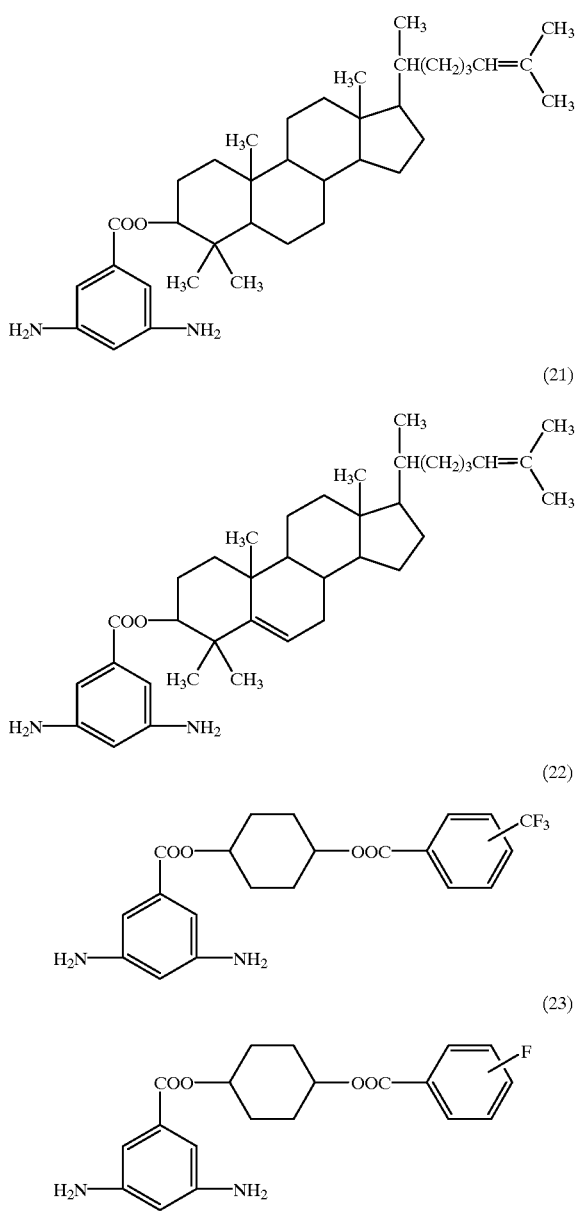

The proportion at which the tetracarboxylic dianhydride and diamine compound are used is preferably a proportion such that the acid anhydride groups in the tetracarboxylic dianhydride are present at 0.2–2 equivalents, and more preferably 0.3–1.2 equivalents, with respect to one equivalent of the amino groups in the diamine compound.

<Polyamic acid>

Synthesis of the polyamic acid as the intermediate for production of the (A) polyimide component, or as the (A) polyimide component itself, is accomplished by reacting the tetracarboxylic dianhydride and the diamine compound in an organic solvent under temperature conditions of normally −20° C. to 150° C., and preferably 0° C. to 100° C.

The organic solvent is not particularly restricted so long as it can dissolve the polyamic acid which is produced, and as examples there may be mentioned aprotic polar solvents such as N-methyl-2-pyrrolidone, N,N-dimethylacetamide, N,N-dimethylformamide, dimethylsulfoxide, γ-butyrolactone, tetramethylurea and hexamethylphosphoryltriamide; esters such as methyl acetate, ethyl acetate, n-propyl acetate, n-butyl acetate, methyl methoxypropionate, ethyl ethoxypropionate, diethyl oxalate, diethyl malonate, ethyl lactate, n-propyl lactate and n-butyl lactate; ketones such as acetone, methyl ethyl ketone, methyl isobutyl ketone and cyclohexanone; and phenols such as phenol, m-cresol, xylenol and halogenated phenol.

The amount of organic solvent to be used is preferably an amount such that the total of the tetracarboxylic dianhydride and the diamine compound is 0.1–30 wt % of the total reaction solution.

The organic solvent may also be used with another organic solvent such as an alcohol, ether, halogenated hydrocarbon or hydrocarbon, so long as the polyamic acid that is produced does not precipitate.

As examples of such other organic solvents there may be mentioned methyl alcohol, ethyl alcohol, isopropyl alcohol, cyclohexanol, ethylene glycol, propylene glycol, 1,4-butanediol, triethylene glycol, ethyleneglycol monomethyl ether, diethyl ether, ethyleneglycol methyl ether, ethyleneglycol ethyl ether, ethyleneglycol n-propyl ether, ethyleneglycol i-propyl ether, ethyleneglycol n-butyl ether, ethyleneglycol dimethyl ether, ethyleneglycol ethyl ether acetate, diethyleneglycol dimethyl ether, diethyleneglycol diethyl ether, diethyleneglycol monomethyl ether, diethyleneglycol monoethyl ether, diethyleneglycol monomethyl ether acetate, diethyleneglycol monoethyl ether acetate, tetrahydrofuran, 1,4-dioxane, dichloromethane, 1,2-dichloroethane, 1,4-dichlorobutane, trichloroethane, chlorbenzene, o-dichlorbenzene, hexane, heptane, octane, benzene, toluene and xylene.

By reacting the tetracarboxylic dianhydride and diamine compound in the manner described above there is obtained an organic solvent solution of a polyamic acid.

The resulting polyamic acid has an inherent viscosity ($\eta_{In}$) value of usually 0.05–10 dl/g, and preferably 0.05–5 dl/g.

Here, the inherent viscosity ($\eta_{In}$) value is determined by the following equation after measuring the falling time of a solution with a concentration of 0.5 g/100 ml in N-methyl-2-pyrrolidone as the solvent, and the falling time of the solvent, at 30° C.

$\eta_{in}$=ln (falling time of solution/falling time of solvent)/(concentration of solution)

<Synthesis of polyimide>

The polyimide as component (A) according to the invention can be synthesized by dehydrating ring closure of the aforementioned polyamic acid.

Dehydrating ring closure of the polyamic acid is accomplished by <i> a heat imidation method whereby the organic solvent solution of the polyamic acid is heated and the water by-product is removed by azeotropic distillation, or <ii> a chemical imidation method whereby a dehydrating agent and dehydrating ring closure catalyst are added to the organic solvent solution of the polyamic acid for reaction, with heating if necessary.

The reaction temperature for method <i> is normally 50° C. to 400° C., and preferably 100° C. to 250° C. If the reaction temperature is lower than 50° C. the dehydrating ring closure reaction will not proceed adequately, while if the reaction temperature is above 400° C. the molecular weight of the resulting polyimide may be reduced.

To facilitate removal of the water by-product in method <i>, there may be included as a dehydrating agent a component which is azeotropic with water and especially which can be easily separated from water outside the reaction system, for example an aromatic hydrocarbon solvent, such as benzene, toluene, xylene, etc.

In order to promote the dehydrating ring closure, a tertiary amine catalyst, for example an aliphatic tertiary amine such as trimethylamine, triethylamine, tri-n-propylamine or tri-n-butylamine; an aromatic tertiary amine such as N,N-dimethylaniline or N,N-diethylaniline; or a heterocyclic tertiary amine such as pyridine, quinoline or isoquinoline, may be added for example at 10–400 parts by weight to 100 parts by weight of the polyamic acid.

As the dehydrating agent in method <ii> there may be used an acid anhydride such as acetic anhydride, propionic anhydride or trifluoroacetic anhydride. The amount of the dehydrating agent to be used is preferably 0.01–20 moles per mole of the repeating polyamic acid unit.

As the dehydrating ring closure catalyst there may be used tertiary amines such as pyridine, collidine, lutidine and triethylamine, without any particular restriction to these. The amount of the dehydrating ring closure catalyst to be used is preferably 0.01–10 moles per mole of the dehydrating agent used.

The reaction temperature for method <ii> is normally 0° C. to 180° C., and preferably 10° C. to 150° C.

The organic solvent used for methods <i> and <ii> may be the same as the organic solvent used for synthesis of the polyamic acid.

The reaction solution obtained by method <i> or <ii> may be poured into a large volume of a poor solvent to precipitate the polyimide, and the precipitate dried under reduced pressure to obtain the polyimide in solid form. The solid polyimide may be subsequently redissolved in an organic solvent and the process of pouring into a poor solvent for precipitation may then be repeated one or more times for purification of the polyimide.

<Terminal-modified polyimide>

The polyimide as component (A) of the invention may be a terminal-modified form with an adjusted molecular weight.

Such a terminal-modified polyimide may be synthesized by adding a carboxylic monoanhydride, a monoamine compound, an amino acid, a monoisocyanate compound or the like to the reaction system during synthesis of the polyamic acid.

As examples of carboxylic monoanhydrides there may be mentioned maleic anhydride, phthalic anhydride, 3-hydroxyphthalic anhydride, itaconic anhydride, n-decylsucclnlc anhydride, n-dodecylsucclnic anhydride, n-tetradecylsuccinic anhydride, n-hexadecylsuccinic anhydride, naphthalenedicarboxylic anhydride and trtmellitlc anhydride.

As examples of monoamine compounds there may be mentioned aniline, cyclohexylamine, n-butylamine, n-pentylamine, n-hexylamine, n-heptylamine, n-octylamine, n-nonylamine, n-decylamine, n-undecylamine, n-dodecylamine, n-tridecylamine, n-tetradecylamine, n-pentadecylamine, n-hexadecylamine, n-heptadecylamine, n-octadecylamine and n-elcosylamlne.

As examples of amino acids there may be mentioned alanlne, cysteine, leucine, lyslne, methionine, phenylalanine, prollne, serine, threonine, tryptophan and valine.

As examples of monoisocyanate compounds there may be mentioned phenyl isocyanate and 1-naphthyl isocyanate.

<Polyimide or polyamic acid with reactive group>

The polyimide or polyamic acid as component (A) of the invention may have one or more reactive groups (a), for example a carboxyl group, amino group, hydroxyl group, sulfonic acid group, amide group, epoxy group, isocyanate group, vinyl group, etc.

When component (A) is a polyimide with a reactive group (a), the reactive group (a) is preferably one that can react with the reactive group (b) in the (B) other polymer component described hereunder. Reaction between the reactive group (a) and the reactive group (b), or through a crosslinking agent, yields a precursor wherein the (A) polyimide component and (B) other polymer component are at least partially bonded. Such a precursor has excellent storage stability in aqueous dispersions in which the precursor is dispersed, and polyimide-based composites with excellent properties can be formed from the precursor. The component (A) of the invention normally contains the reactive group (a) at 0.1–50 mole percent, preferably 0.2–30 mole percent, and more preferably 0.5–20 mole percent.

As examples of methods of synthesizing the polyimide or polyamic acid with the reactive group (a) there may be mentioned <iii> a method whereby the amic acid groups present in the polyamic acid (i.e. the free carboxyl groups and amide groups formed from the tetracarboxylic dianhydride and diamine compound in the reaction starting material) are left after the dehydrating ring closure reaction; and <iv> a method whereby a compound with a reactive group (a) is used as the starting material for the tetracarboxylic dianhydride, diamine compound, carboxylic monoanhydride, monoamine compound, etc. used for synthesis of the polyamic acid, and the reactive group (a) is left after the dehydrating ring closure reaction.

When heat imidation is employed for dehydrating ring closure reaction of the polyamic acid, method <iii> can be carried out by appropriately controlling the reaction time and reaction temperature to adjust the imidation rate. When the reactive group (a) contributes to the dehydrating ring closure reaction, method <iv> can be carried out by changing the amounts of dehydrating agent and dehydrating ring closure catalyst added to adjust the imidation rate. When the reactive group (a) does not contribute to the dehydrating ring closure reaction in method <iv>, there is no particular need to adjust the reaction conditions. Of these methods, method <iv> is generally preferred from the standpoint of ease of adjusting the imidation rate.

The polyimide or polyamic acid used as component (A) obtained in the manner described above has an inherent viscosity ($\eta_{In}$) value of usually 0.05–10 dl/g, and preferably 0.05–5 dl/g. Here, the inherent viscosity ($\eta_{In}$) value is determined by the same method as the ($\eta_{In}$) value for the polyamic acid described above. The molecular weight (number-average molecular weight Mn) is normally 1000–100,000, and preferably 5000–50,000, in terms of polystyrene measured by GPC.

Component (A) used for the polyimide-based composite of the invention is preferably one or more selected from among the aforementioned polyimides, polyamic acids, terminal-modified polyimides, and polyimides and polyamic acids with reactive groups. Of these, it is preferred to use terminal-modified polyimides and polyimides and polyamic acids with reactive groups. Using these for component (A) results in satisfactory reactivity with the reactive group of component (B), thus giving a polyimide-based composite with even better properties.

The aforementioned compounds are also preferred for use as component (A) in the polyimide-based aqueous dispersion of the invention .

(B) Other Polymer Component

The (B) other polymer component in the polyimide-based composite of the invention may be any polymer so long as the elastic modulus of the resulting polyimide composite is less than 10 GPa and the polyimide derived from component (A) forms a continuous phase in the composite while the other polymer derived from component (B) forms a discontinuous phase. Preferred are those with a reactive group (b) that can react with component (A) either directly or indirectly through a crosslinking agent.

The (B) other polymer component in the polyimide-based dispersion of the invention is not particularly restricted, but the components (B) preferred for use in the polyimide-based composite of the invention are also preferred for the dispersion.

The elastic modulus of the other polymer alone in component (B) of the invention is preferably 0.0001–0.5 GPa, more preferably 0.0005–0.3 GPa, and especially 0.001–0.1 GPa. When the elastic modulus of component (B) is within this range it is easier to obtain a polyimide-based composite with an elastic modulus of less than 10 GPa. The "elastic modulus of the other polymer alone" mentioned above refers to the value determined when the other polymer has been formed into a film by casting.

The glass transition temperature of the other polymer as component (B) is preferably in the range of +120° C. to −200° C., and more preferably in the range of +80° C. to −120° C. A glass transition temperature within this range will result in a polyimide-based composite with more satisfactory adhesive and molding properties.

As specific examples of component (B) to be used for the invention there may be mentioned vinyl monomer polymers such as acryl polymers, natural rubbers and their epoxified forms, polybutadienes and their epoxified forms, styrene-butadiene rubber, isoprene rubber, urethane rubber, acrylonitrile rubber, ethylene-propylene rubber, fluorine polymers, silicone polymers, etc., which may be used alone or in combinations of two or more.

As a preferred method of forming the polyimide-based composite using a precursor comprising the aforementioned component (A) and component (B), there may be mentioned <a> a method using an organic solvent solution of the precursor, and <b> a method using an aqueous dispersion obtained by dispersing the precursor in particle form in an aqueous medium, which are explained below.

<Component (B) used in method <a>>

Component (B) used in the precursor for formation of a polyimide-based composite by method <a> will now be explained in detail.

As preferred examples for the reactive group (b) of component (B) there may be mentioned amino groups, carboxyl groups, acid anhydride groups, hydroxyl groups, epoxy groups, isocyanate groups, organosiloxanyl groups, vinyl groups and ketone groups.

The following monovinyl monomers and polyvinyl monomers may be mentioned as vinyl monomers that can be used to synthesize component (B).

I. Monovinyl monomers:

(1) Amino group-containing monomers

Aminoalkyl group-containing (meth)acrylates such as 2-dimethylaminoethyl (meth)acrylate, 2-diethylaminoethyl (meth)acrylate, 2-dimethylaminopropyl (meth)acrylate and 3-dimethylaminopropyl (meth)acrylate;

aminoalkoxyalkyl group-containing (meth)acrylates such as 2-(2-dimethylaminoethoxy)ethyl (meth)acrylate, 2-(2-diethylaminoethoxy)ethyl (meth)acrylate, 2-(2-dimethylaminoethoxy)propyl (meth)acrylate and 3-(2-dimethylaminoethoxy)propyl (meth)acrylate;

N-aminoalkyl group-containing (meth)acrylamides such as N-(2-dimethylaminoethyl) (meth)acrylamide, N-(2-diethylaminoethyl) (meth)acrylamide, N-(2-dlmethylaminopropyl) (meth)acrylamide and N-(3-dimethylaminopropyl) (meth)acrylamide;

amino group-containing aromatic vinyl compounds such as p-dimethylaminomethylstyrene, p-diethylaminomethylstyrene, p-dimethylaminomethyl-α-methylstyrene, p-diethylaminomethyl-α-methylstyrene, p-(2-dimethylaminoethyl)styrene, p-(2-diethylaminoethyl)styrene, p-(2-dimethylaminoethyl)-α-methylstyrene, p-(2-diethylaminoethyl)-α-methylstyrene, 2-vinylpyrene and 4-vinylpyrene;

addition products of glycidyl (meth)acrylate and primary or secondary amine compounds, salts wherein the amino groups in these monomers have been neutralized or quaternized, etc.

(2) Carboxyl group-containing monomers

Unsaturated carboxylic acids such as (meth)acrylic acid, crotonic acid, cinnamic acid, maleic acid, fumaric acid, itaconic acid and salts thereof;

esters containing free carboxyl groups of unsaturated polycarboxylic acids, such as monomethyl maleate ester, monoethyl maleate ester, monomethyl fumarate ester, monoethyl fumarate ester and salts thereof;

mono(2-(meth)acryloyloxyalkyl) esters of non-polymerizable dicarboxylic acids, such as mono(2-(meth)acryloyloxyethyl) succinate ester, mono(2-(meth)acryloyloxyethyl) fumarate ester and salts thereof.

(3) Hydroxyl group-containing monomers

There may be mentioned 2-hydroxyethyl (meth)acrylate, 2-hydroxypropyl (meth)acrylate, 3-hydroxypropyl (meth)acrylate, N-methylol (meth)acrylamide, 2-(meth)acryloyloxyethyl and 2-hydroxyethyl diesters of fumaric acid, etc.

(4) Sulfonic acid-containing monomers p-styrenesulfonic acid, p-α-methylstyrenesulfonic acid, isoprene sulfonide and salts thereof.

(5) Amide group-containing monomers (Meth)acrylamide, crotonic amide, cinnamic amide, maleic diamide and fumaric diamide.

(6) Epoxy group-containing monomers

Glycidyl (meth)acrylate, allylglycidyl ether and 3,4-epoxycyclohexyl (meth)acrylate.

(7) Isocyanate group-containing monomers

There may be mentioned 2-isocyanatoethyl 3(meth)acrylate, 2-isocyanatopropyl (meth)acrylate, 3-isocyanatopropyl (meth)acrylate, etc.

(8) Other monovinyl monomers (Cyclo)alkyl (meth)acrylates such as methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, t-butyl (meth)acrylate, n-hexyl (meth)acrylate, 2-ethylhexyl (meth)acrylate, lauryl (meth)acrylate, stearyl (meth)acrylate and cyclohexyl (meth)acrylate; alkoxy(cyclo)alkyl (meth)acrylates such as 2-methoxyethyl (meth)acrylate, 2-ethoxyethyl (meth)acrylate, 2-methoxypropyl (meth)acrylate, 3-methoxypropyl (meth)acrylate, 2-methoxybutyl (meth)acrylate, 3-methoxybutyl (meth)acrylate, 4-methoxybutyl (meth)acrylate and p-methoxycyclohexyl (meth)acrylate;

cyano group-containing monomers such as (meth)acrylonitrile, vinylidene cyanide, crotonnitrile, 2-cyanoethyl (meth)acrylate, 2-cyanopropyl (meth)acrylate and 3-cyanopropyl (meth)acrylate;

N-alkoxyalkyl-substituted derivatives of the aforementioned amide group-containing monomers, such as N-methoxymethyl (meth)acrylamide, N-ethoxymethyl (meth)acrylamide, N-(2-methoxyethyl) (meth)acrylamide, N-(3-methoxypropyl) (meth)acrylamide, N-(4-methoxybutyl) (meth)acrylamide and diacetone (meth)acrylamide;

fluoroalkyl (meth)acrylates such as trifluoroethyl (meth)acrylate, pentafluoropropyl (meth)acrylate and heptafluorobutyl (meth)acrylate;

siloxanyl compounds such as trimethylsiloxanyl dimethylsilylpropyl (meth)acrylate, tris(trimethylsiloxanyl) silylpropyl (meth)acrylate and di(meth)acryloylpropyl dimethylsilyl ether;

monovinyl aromatic compounds such as styrene, o-vinyltoluene, m-vinyltoluene, p-vinyltoluene, p-ethylstyrene, α-methylstyrene, α-fluorostyrene, chloromethylstyrene, t-butoxystyrene and hydroxystyrene;

halogenated vinyl compounds such as vinyl chloride and vinylidene chloride;

vinyl esters such as vinyl acetate, vinyl chloroacetate and vinyl priopionate;

olefins such as ethylene and propylene;

vinyl group-containing sulfonic acids such as styrenesulfonic acid, and salts thereof;

as well as silicone-modified monomers, macromonomers, and the like.

II. Polyvinyl monomers (1) Polyvinyl aromatic compounds

Divinylbenzene, diisopropenylbenzene, etc.

(2) Di(meth)acrylates

Bis(meth)acrylamides such as ethylene bis(meth)acrylamide, trimethylene bis(meth)acrylamide and tetramethylene bis(meth)acrylamide; ethyleneglycol di(meth)acrylate, diethyleneglycol di(meth)acrylate, polyethyleneglycol diacrylate, propyleneglycol di(meth)acrylate, dipropyleneglycol di(meth)acrylate, polypropyleneglycol di(meth)acrylate, 1,3-butyleneglycol di(meth)acrylate, 1,4-butyleneglycol di(meth)acrylate, 1,6-hexyleneglycol di(meth)acrylate, neopentylglycol di(meth)acrylate, 2,2-bis(4-(meth)acryloxypropioxyphenyl)propane and 2,2-bis(4-(meth)acryloxydiethoxyphenyl)propane.

(3) Monomers with 3 or more (meth)acryloxy groups

Glycerin tri(meth)acrylate, trimethylolpropane tri(meth)acrylate, trimethylolethane tri(meth)acrylate, pentaerythritol tetra(meth)acrylate and di-trimethylolpropane tetraacrylate.

(4) Others

Unsaturated aliphatic hydrocarbons such as butadiene, isoprene, dicyclopentadiene, ethylidene norbornene, etc.; and isoprenesulfonic acid.

<Component (B) used in method <b>>

Component (B) used in the precursor for formation of the polyimide-based composite by method <b> will now be explained in further detail.

Component (B) preferably comprises a "hydrophilic polymer" having at least one hydrophilic group such as an amino group, carboxyl group, hydroxyl group, sulfonic acid group or amide group, and having a solubility in 20° C. water of preferably at least 0.01 g/100 g and more preferably at least 0.05 g/100 g.

The hydrophilic polymer is preferably (B-1) a cationic polymer or (B-2) an anionic polymer. The (B-1) cationic polymer is a polymer with at least one cationic hydrophilic group, for example an amino group, a quaternized salt of an amino group, etc. The (B-2) anionic polymer is a polymer with at least one anionic hydrophilic group, for example a carboxyl group, sulfonic acid group or a salt thereof. If necessary the cationic polymer or anionic polymer may also have another hydrophilic group, for example a hydroxyl group, amide group, etc.

The hydrophilic polymer preferably has at least one reactive group (b) that can react with the reactive group (a) in component (A) in addition to the hydrophilic group. As reactive groups (b) there may be mentioned, for example, epoxy groups, isocyanate groups and carboxyl groups, as well as the same hydrophilic groups mentioned above.

The hydrophilic polymer is preferably a simple polymer of a monovinyl monomer with a hydrophilic group (hereunder referred to as "hydrophilic monomer"), or a copolymer containing the hydrophilic monomer unit at usually 0.1–80 wt %, preferably 1–60 wt %, and more preferably 3–50 wt %.

The hydrophilic polymer is also preferably a copolymer containing normally 0.1–30 wt %, preferably 0.2–20 wt % and more preferably 0.5–15 wt % of a monovinyl monomer unit with a reactive group (b) that can react with the reactive group (a) in component (A) (hereunder referred to as "reactive monomer").

For the aforementioned hydrophilic monomer or reactive monomer, the monomer containing a cationic hydrophilic group may be any of the compounds mentioned under n(1) Amino group-containing monomers of "I. Monovinyl monomers" in the explanation for component (B) used in method <a>.

For the aforementioned hydrophilic monomer or reactive monomer, the monomer containing an anionic hydrophilic group may be any of the compounds mentioned under "(2) Carboxyl group-containing monomers" or "(4) Sulfonic acid group-containing monomers" of "I. Monovinyl monomers" above.

The monomer containing another hydrophilic group, for example a hydroxyl group or amide group, may be any of the compounds mentioned respectively under "(3) Hydroxyl group-containing monomers" and "(5) Amide group-containing monomers" of "I. Monovinyl monomers" above.

The monomer with an epoxy group or isocyanate group as the reactive group (b) may be any of the compounds mentioned respectively under "(6) Epoxy group-containing monomers" and "(7) Isocyanate group-containing monomers" of "I. Monovinyl monomers" above.

The other monovinyl monomer that is copolymerizable with the aforementioned hydrophilic monomer or reactive monomer may be any of the compounds mentioned under "(8) Other monovinyl monomers" of "I. Monovinyl monomers" above.

Any of the compounds mentioned for example under "II. Polyvinyl monomers" may be used in an amount that does not hamper the hydrophilicity of the resulting copolymer.

Whether method <a> or method <b> is used, the (B) other polymer component can be produced by carrying out a publicly known polymerization method (radical, anionic, cationic, etc.) using one monovinyl or polyvinyl monomer, or two or more, in the presence of a chain transfer agent if necessary.

Preferred for component (B) are elastic polymers or elastic polymers with reactive groups, of which elastic polymers with reactive groups are particularly preferred. Here, an "elastic polymer" is one wherein the elastic modulus of component (B) alone is within the above-mentioned preferred range, and whose glass transition temperature is within the above-mentioned preferred range. Using an elastic polymer with a reactive group as component (B) will result in satisfactory reactivity with the reactive group of component (A) and give a polyimide-based composite with even more excellent properties.

The hydrophilic polymer in component (B) of the invention may also be a publicly known hydrophilic polymer which satisfies the above-mentioned solubility conditions in water, for example, polyvinylpyrrolidone, polyethyleneimine, polyallylamine, polystyrene sulfonide, styrene-isoprene copolymer sulfonide, etc.

The number-average molecular weight (hereunder, "Mn") of the hydrophilic polymer used for the invention as determined by gel permeation chromatography (GPC) is normally 1000–100,000, and preferably 3000–20,000, in terms of polystyrene.

Also, one hydrophilic polymer alone or two or more in combination may be used.

Other Materials Used for Composite

The polyimide-based composite of the invention may also contain if necessary the following crosslinking agents, crosslinking aids, additives, etc. in addition to the aforementioned component (A) and component (B). The method used for these may be addition to the precursor comprising component (A) and component (B) during its preparation, addition to the precursor after its preparation, addition during preparation of the organic solvent solution or aqueous dispersion of the precursor, or addition after preparation of the organic solvent solution or aqueous dispersion.

<Crosslinking agent>

The crosslinking agent used to form the polyimide-based composite of the invention is a compound with at least two groups in the same molecule that are reactive with the (A) polyimide component and (B) other polymer component.

Specifically there may be mentioned:

epoxy compounds such as epoxified polybutadiene, bisphenol A-type epoxy resins, bisphenol F-type epoxy resins, naphthalene-based epoxy resins, fluorene-based epoxy resins, biphenyl-type epoxy resins, glycidyl ester-type epoxy resins, phenol novolac resin-type epoxy resins, etc.;

isocyanate compounds such as tolylene diisocyanate and their blocked forms;

vinyl compounds such as ethyleneglycol di(meth) acrylate, divinylbenzene, pentaerythritol tri(meth) acrylate and trimethylolpropane tri(meth)acrylate;

thiols such as triazine trithiol;

vulcanizing agents such as sulfur and 4,4'-dithio-bis-dimorpholine;

carboxylic acids such as terephthalic acid, succinic acid and trimellitic acid;

hydrazines such as aziridine hydrazide;

alcohols such as ethylene glycol and propylene glycol;

hydroxycarboxylic acids such as tartaric acid and malic acid;

and amino acids such as cysteine and proline.

<Crosslinking aid>

As examples of crosslinking aids to accelerate or initiate the crosslinking reaction there may be mentioned amines and their salts, photoacid generators, various radical generators, photosensitizing agents, and the like. These may be added alone during preparation of the precursor, or they may be introduced beforehand into a side chain of the polymer. These crosslinking aids can be used alone or in combinations of two or more. The aforementioned crosslinking agent and crosslinking aid will usually be used together, but a crosslinking aid may also be used alone without a crosslinking agent.

<Additives>

In addition, the polyimide-based composite of the invention may also contain if necessary other additives, for example antioxidants, thermal stabilizers, ultraviolet absorbers, light stabilizers, antistatic agents, flame retardants, coloring agents, lubricants, anticlouding agents, adhesive enhancers, mildewproofing agents, etc. These additives can be used alone or in mixtures of two or more.

Packing Materials and Reinforcing Materials

The polyimlde-based composite of the invention may if necessary be molded in admixture with one, two or more packing materials such as clay, zeolite, talc, mica, silica, carbon black, graphite, alumina, calcium carbonate, wallastonite, etc. or reinforcing materials such as fibers or whiskers of glass, carbon, alumina, potassium titanate, aluminum borate, silicon carbide, silicon nitride, aromatic polyamides, polyamidoimides, polyimides, total aromatic polyesters, ultra-high molecular weight polyethylene, high-strength polyacrylonitrile or high-strength polyvinyl alcohol.

The reinforcing materials may be used for example in the form of a woven, nonwoven or knitted fabric, with the organic solvent solution or aqueous dispersion of the precursor of the invention impregnated into the fabric.

Preparation of Precursor and Formation of Polyimide-Based Composite

The polyimide-based composite of the invention is formed from the precursor comprising the aforementioned component (A) and component (B). As preferred methods for forming the polyimide-based composite from the precursor there may be mentioned the following methods <a> and <b>.

<a> A method using an organic solvent solution (varnish) of the precursor.

<b> A method using an aqueous dispersion wherein the precursor is dispersed in particle form in an aqueous medium.

<Organic solvent solution of precursor>

The varnish used for method <a> above may be prepared by mixing component (A) and component (B) in the absence of a solvent together with the various additives used depending on the case, and then dissolving this in an organic solvent, or by mixing component (A) and component (B) in an appropriate organic solvent. Preparation by the latter method is preferred.

The solvent used for preparation of the varnish is not particularly restricted so long as it is inert to the (A) polyimide component and (B) other polymer component, but it is preferably one that can uniformly dissolve them. As examples of such solvents there may be mentioned polar solvents such as N-methyl-2-pyrrolidone, γ-butyrolactone, cyclohexanone, tetrahydrofuran, etc. which are used for synthesis of the polyimide. These solvents can be used alone or in mixtures of two or more.

The amount of solvent used for preparation of the varnish is preferably 10–10,000 parts by weight, and more preferably 20–5000 parts by weight, to 100 parts by weight of the total of component (A) and component (B).

By thus mixing the (A) polyimide component, the (B) other polymer component and if necessary also a crosslinking agent component, etc. in an organic solvent, for example, there is obtained a varnish in which component (A) and component (B) are uniformly mixed and which forms a polyimide-based composite according to the invention. In some cases, a reaction will occur in the varnish whereby component (A) and component (B) are bonded either directly or indirectly through the crosslinking agent.

<Aqueous dispersion of precursor>

The polyimide-based aqueous dispersion used for method <b> is obtained by dispersing the precursor in particulate form in an aqueous medium. The particles preferably include in the same particles the (A) polyimide component and (B) other polymer component composed of a hydrophilic polymer, and have a mean particle size of 0.03–5 µm.

The aqueous medium referred to here means a medium whose main component is water. In this case, the content of water in the aqueous medium is usually at least 40 wt %, and preferably at least 50 wt %. Other media which may be used with water in some cases include, for example, the aforementioned aprotic polar solvents, esters, ketones, phenols, etc. used for production of the polyamic acid or polyimide.

The polyimide-based aqueous dispersion may be prepared by the following methods, for example:

(I) A method whereby the (A) polyimide component and (B) other polymer component are mixed in a dissolved state in an organic solvent, after which the mixed solution is dispersed in particle form in an aqueous medium to form particles of the prescribed mean particle size, removing at least a portion of the organic solvent depending on the case;

(II) A method whereby the (A) polyimide component and (B) other polymer component are mixed in a solid state to make particles of the prescribed mean particle size, after which the particles are dispersed in an aqueous medium; although method (I) is preferred. These methods may be carried out with heating if necessary.

The methods for producing a polyimide-based aqueous dispersion according to the invention will now be explained in more detail, with focus on method (I).

As examples of methods in which the (A) polyimide component and (B) other polymer component are mixed in a dissolved state in an organic solvent there may be mentioned:

(i) a method whereby a separately prepared solution of the (A) polyimide component and solution of the (B) other polymer component are mixed;

(ii) a method whereby either the (A) polyimide component or the (B) other polymer component is added as a solid to a solution of the other for mixed dissolution; and (iii) a method whereby both the (A) polyimide component and the (B) other polymer component are added as solids to an organic solvent for mixed dissolution. Method (i) is particularly preferred.

The organic solvent used for mixture of the (A) polyimide component and (B) other polymer component in a dissolved state is not particularly restricted so long as it is inert to component (A) and component (B) and can dissolve them. For example, the aprotic polar solvents, esters, ketones and phenols used for production of the polyamic acid or polyimide and the polar solvents used for synthesis of the hydrophilic polymer may be mentioned. These organic solvents can be used alone or in combinations of two or more. For method (i), the organic solvents used for the solution of component (A) and the solution of component (B) may be the same or different.

Depending on the purpose, other compounds may also be added to the mixed solutions obtained by methods (i) to (iii).

As examples of such compounds there may be mentioned epoxy compounds such as epoxified polybutadiene, bisphenol A-type epoxy resins, naphthalene-based epoxy resins, fluorene-based epoxy resins, biphenyl-type epoxy resins and glycidyl ester-type epoxy resins; isocyanate compounds such as tolylene diisocyanate and their blocked forms; and thermoplastic or thermosetting resins such as high-density polyethylene, medium-density polyethylene, polypropylene, polycarbonate, polyallylate, aliphatic polyamides, polyamidoimides, polysulfone, polyethersulfone, polyetherketone, polyphenylene sulfide, (modified) polycarbodiimide, polyetherimide, polyesterimide and modified polyphenylene oxide. These compounds may be used alone or in mixtures of two or more.

The solid portion concentration of the mixed solution of component (A) and component (B) is preferably 5–60 wt %, and more preferably 10–50 wt %, as the total weight of both components.

For mixture of component (A) and component (B) in the solution state there may be employed suitable mixing means such as a stirrer, ribbon, screw or the like. The rotation speed for mixture is normally 10–50,000 rpm, with 20–5000 rpm being preferred.

A surfactant may also be added in a suitable amount as necessary during mixture of component (A) and component (B) in the solution state. However, when the polyimide-based composite formed from the aqueous dispersion is to be used as an insulating material, the surfactant can result in lower insulation durability, and therefore it is preferably used in as low an amount as possible.

For dispersion of component (A) and component (B) in the aqueous medium, a polyacid is preferably used as a pH regulator when component (B) is (B-1) a cationic polymer, and a polyamine is preferably used as a pH regulator when component (B) is (B-2) an anionic polymer.

As examples of polyacids there may be mentioned:

(a) organic polyacids represented by dicarboxylic acids such as oxalic acid, malonic acid, succinic acid, glutaric acid, adipic acid, fumaric acid, malic acid, tartaric acid, itaconic acid, hexahydrophthalic acid, terephthalic acid, tetrahydrophthalic acid, suberic acid and naphthalenedicarboxylic acid; tricarboxylic acids such as tricarbaryl acid, citric acid and benzenetricarboxylic acid; and tetracarboxylic acids such as benzenetetracarboxylic acid, butanetetracarboxylic acid and cyclohexanetetracarboxylic acid; and (b) inorganic polyacids represented by sulfuric acid, phosphoric acid, etc. Among these are preferred organic polyacids, with dicarboxylic acids being especially preferred.

These polyacids may be used alone or in combinations of two or more. They may also be used with monofunctional acids such as formic acid and acetic acid.

As examples of preferred polyamines there may be mentioned diamines such as ethylenediamine and hexamethylenediamine.

These polyamines may be used alone or in combinations of two or more. They may also be used with monoamines such as ethanolamine.

The aforementioned polyacid or polyamine serves the function of pH regulator, and using these polyfunctional ones will provide notable improvement in the dispersion stability of the polyimide-based aqueous dispersion of the invention.

The polyacid or polyamine is preferably used so that the pH of the resulting polyimide-based aqueous dispersion is 3–11, and more preferably 4–10, because this will give an aqueous dispersion with particularly excellent storage stability.

This pH regulation can be achieved, for example, by (iv) a method whereby the necessary amount of the pH regulator is added to a mixed solution of component (A) and component (B), which is then dispersed in an aqueous medium, v) a method whereby a mixed solution of component (A) and component (B) is dispersed in an aqueous medium to which the necessary amount of the pH regulator has been added, and (vi) a method whereby a mixed solution of component (A) and component (B) is dispersed in an aqueous medium while the necessary amount of the pH regulator is added. Method (iv) is particularly preferred.

For pH regulation when preparing the polyimide-based aqueous dispersion by method (II) above, the necessary amount of the pH regulator may be added beforehand to the aqueous medium.

As the method for dispersing the mixed solution of component (A) and component (B) in the aqueous medium, the aqueous medium may be added to the mixed solution or the mixed solution may be added to the aqueous medium. The latter method is especially preferred.

For dispersion of the mixed solution of component (A) and component (B) in the aqueous medium, there may be employed suitable mixing means such as a stirrer, ribbon, screw or the like. The mixing conditions will differ depending on the solid portion concentration of the polyimide-based aqueous dispersion, the prescribed mean particle size of the dispersed particles, etc., but the preferred rotation speed is normally 10–50,000 rpm, with 20–5000 rpm being more preferred.

The method of removing the organic solvent or medium other than water when preparing the polyimide-based aqueous dispersion may be, for example, distillation or ultrafiltration.

The total amount of aqueous media used in the polyimide-based aqueous dispersion of the invention is preferably 10–10,000 parts by weight, and more preferably 20–5000 parts by weight to 100 parts by weight of the total of component (A) and component (B).

The mean particle size of the particles dispersed in the polyimide-based aqueous dispersion of the invention is 0.03–5 $\mu$m, and preferably 0.05–2 $\mu$m. If the mean particle size of the particles is less than 0.03 $\mu$m the viscosity of the aqueous dispersion will be too high, while if it exceeds 5 $\mu$m the storage stability of the aqueous dispersion will be reduced, leading to easier precipitation of the particles. The mean particle size can be measured by a publicly known optical method or with an electron microscope.

For production of a polyimide-based aqueous dispersion according to the invention, it is preferred to provide an appropriate combination of the reactive group (a) in component (A) and the reactive group (b) in component (B), mix component (A) and component (B) in a dissolved state in an organic solvent and react them while heating if necessary to prepare a polyimide-based composite precursor, and then mix the react solution containing the precursor with an aqueous medium, removing at least a portion of the organic solvent depending on the case. This will allow production of a polyimide-based aqueous dispersion wherein component (A) and component (B) are bonded together in the same particles and the particles with the prescribed mean particle size (the particles of the precursor which forms the polyimide-based composite) are dispersed in the aqueous medium, and will result in excellent storage stability of the dispersion and excellent properties of the polyimide-based composite formed from the dispersion.

It is thought that the hydrophilic polymer as component (B) in the polyimide-based aqueous dispersion of the invention exhibits an effect of dispersing the precursor particles in a stabilized state in the aqueous medium by being included in the same particles with the (A) polyimide component.

So long as the polyimide-based aqueous dispersions of the invention include component (A) and component (B) in the same particles and the particles of the precursor whose mean particle size is within the aforementioned range are dispersed, the polyimide-based composites formed from the aqueous dispersions do not necessarily need to satisfy the conditions of claim 1. In other words, a polyimide-based composite obtained from a polyimide-based aqueous dispersion of the invention may have an elastic modulus of 10 GPa or greater, and it is not necessary to form a continuous phase made of the polyimide and a discontinuous phase made of the other polymer. In this case as well, a polyimide-based aqueous dispersion of the invention can give an effect of much better storage stability than a conventional polyimide-based aqueous dispersion.

<Formation of polyimide-based composite>

The polyimide-based composite of the invention may be obtained, for example, by removing the solvent from the varnish or aqueous dispersion of the aforementioned precursor and heating to promote a crosslinking reaction. A polyimide-based aqueous dispersion according to the invention may be suitably used as the aqueous dispersion of the precursor.

The elastic modulus of the polyimide-based composite of the invention obtained in this manner is less than 10 GPa, and preferably 0.001 GPa–9.8 GPa, as the value measured by a publicly known method at room temperature. It is more preferably in the range of 0.001–5 GPa, and even more preferably 0.01–0.98 GPa. An elastic modulus of 10 GPa or greater will result in lower adhesion.

The elastic modulus of the polyimide-based composite is measured by preparing a test piece from a film formed from a polyimide-based composite which is a composite formed from component (A) and component (B), a composite formed from component (A), component (B), a crosslinking agent and/or a crosslinking aid, or a composite formed by mixing additives with these, and subjecting the test piece to an expanding or vented dynamic viscoelastic measuring apparatus at normal temperature.

The elastic modulus of the polyimide-based composite of the invention is the value measured for the polyimide-based composite as a mixture formed by combining component (A) and component (B) with a crosslinking agent, crosslinking aid or additives.

In the polyimide-based composite of the invention, the polyimide forms a continuous phase while the other polymer forms a discontinuous phase which is surrounded by the continuous phase of the polyimide. By having this type of structure, the polyimide-based composite of the invention has a high level balance between the properties of insulation, etc. contributed by the polyimide and the properties of satisfactory adhesion and moldability contributed by the other polymer, so that the object of the present invention can thus be achieved.

The size of the discontinuous phase made of the other polymer in this structure is represented by the number-mean particle size in terms of circle-equivalent size, and it is preferably 0.01–0.9 $\mu$m, more preferably 0.03–0.7 $\mu$m and even more preferably 0.05–0.5 $\mu$m. The mean particle size of the discontinuous phase can be calculated by image analysis of an electron micrograph taken by the method described below.

FIG. 1 is a ruthenium-dyed electron micrograph of a film cross-section of a polyimide-based composite fabricated according to Example 3, where the dark portions are the polyimide phase (continuous) and the light portions are the phase of the other polymer (discontinuous). From FIG. 1 it is seen that the polyimide forms a continuous phase while the other polymer forms a discontinuous phase surrounded by the polyimide continuous phase. The size of the discontinuous phase is 0.2 μm in terms of the number-mean particle size. The film fabricated in Example 3 has very excellent electrical insulating properties and very excellent adhesion.

In the polyimide-based composite of the invention, it is preferred for the polyimide and the other polymer to be physically or chemically bonded, with chemical bonding being most preferred. The polyimide and the other polymer may be bonded from the polyimide-based composite precursor stage. In either case, the polyimide and the other polymer may be partially bonded.

The proportions at which the (A) polyimide component and (B) other polymer component are used to form the polyimide-based composite of the invention are normally 5–95 parts by weight, preferably 10–90 parts by weight and more preferably 20–80 parts by weight of the (A) polyimide component, and normally 95–5 parts by weight, preferably 10–90 parts by weight and more preferably 20–80 parts by weight of the (B) other polymer component with respect to 100 parts by weight (solid portion) of the total of both component (A) and component (B). If the proportion of component (B) is too great, the electrical insulating property of the polyimide-based composite will tend to be lower. On the other hand, if the proportion of component (A) is too great, the adhesion of the polyimide-based composite will tend to be lower, or the storage stability of the polyimide-based aqueous dispersion may be reduced. When the proportions at which the (A) polyimide component and (B) other polymer component are used are within these ranges, the adhesion and water resistance of the polyimide-based composite of the invention will be even better. This will also further improve the electrical insulating property, adhesion and water resistance of electronic parts provided with resin layers made of the polyimide-based composite.

The polyimide-based composite of the invention is formed from the above-mentioned (A) polyimide component and (B) other polymer component, but if necessary it may be formed using the above-mentioned crosslinking agent and/or crosslinking aid, with admixture of the above-mentioned other additives if necessary.

When a crosslinking agent is used, it is added in an amount of preferably 1–500 parts by weight and more preferably 10–100 parts by weight to 100 parts by weight of component (B), while a crosslinking aid is added in an amount of preferably 0.01–200 parts by weight and more preferably 1–50 parts by weight to 100 parts by weight of component (B).

When the aforementioned additives are used, they are added in an amount of preferably a maximum of 30 wt % and more preferably a maximum of 20 wt % with respect to the total amount of the polyimide-based composite formed.

In the polyimide-based composite formed by combining component (A) and component (B), or if necessary a crosslinking agent, crosslinking aid and at least one type of additive, the amount of the (A) polyimide component used with respect to the total amount of the polyimide-based composite is preferably at least 5 wt % and less than 50 wt %, and more preferably at least 10 wt % and less than 45 wt %.

The crosslinking agent and/or crosslinking aid included in the polyimide-based composite of the Invention reacts with either or both component (A) and component (B) and is present in either the continuous phase or discontinuous phase of the composite, or in both phases. The additives included in the polyimide-based composite of the invention are also present in either the continuous phase or discontinuous phase of the composite, or in both phases. In other words, the continuous phase of the composite of the invention may include the crosslinking agent, etc. in addition to the polyimide, while the discontinuous phase may also contain the crosslinking agent, etc. in addition to the other polymer.

Production and Use of Film-Like Composite

When the polyimide-based composite of the invention is made into a film form, the film-like polyimide-based composite (hereunder referred to as "film-like composite") may be formed by the following methods (1) or (2), for example.

(1) Coating method: After coating a varnish or aqueous dispersion of the precursor onto a substrate, the solvent is removed by drying, etc. to produce a precursor film (thermosetting film) on the substrate, and the precursor film is further heated to promote a crosslinking reaction to obtain a film-like composite (cured film).

(2) Electrodeposition method: An aqueous dispersion of the precursor is used as an electrodeposition solution for electrodeposition of the precursor particles dispersed in the electrodeposition solution on a substrate to produce a precursor film, and the precursor film is further heated to promote a crosslinking reaction to obtain a film-like composite.

A polyimide-based aqueous dispersion according to the invention may be suitably used as the aforementioned aqueous dispersion of the precursor.

<Film laminate>

The aforementioned film-like composite or its precursor may be formed on a metal foil such as copper foil, for example, to construct a film laminate having a resin layer made of the polyimide-based composite of the invention or its precursor, and a metal layer. The resin layer can be produced by directly coating the metal foil with a varnish in which component (A) and component (B) have been mixed and dissolved, or with the aforementioned polyimide-based aqueous dispersion, by a method using a roll coater, dip coater, curtain coater or the like, and then drying it by a dry system method.

It may also be produced by electrodeposition on the metal foil by an electrodeposition method using the polyimide-based aqueous dispersion as the electrodeposition solution, and then drying it.

It may also be formed by a method whereby the precursor of the polyimide-based composite is made into a film by a dry system method, fusion method, press method, etc. using the aforementioned varnish or aqueous dispersion to fabricate a precursor film with no base (hereunder also referred to as "precursor film (alone)"), after which the precursor film (alone) and the metal foil are attached together.

After uniformly impregnating a suitable substrate with the aforementioned varnish or aqueous dispersion, it may be heated at an appropriate temperature for removal of the solvent and drying to produce a prepreg of the precursor, and then a prescribed number of the prepregs may be laminated, laying the metal foil on one or both sides thereof, and subjecting this to thermal compression for complete hardening to produce a film laminate having a resin layer made of the polyimide-based composite. The heating temperature here is normally 100–250° C. and preferably 150–200° C., and the heating time is about 10–60 minutes. The pressure conditions are normally about 5–100 Kg/cm$^2$.

The substrate used for production of the prepreg may be any conventionally known substrate such as a glass cloth, quartz glass cloth, aromatic ainide fiber fabric, glass nonwoven fabric, paper carbon fibers or the like. The substrate is impregnated with the varnish or aqueous dispersion such that the weight of the formed polyimide-based composite is usually 10–80 wt % and preferably 30–70 wt % with respect to the weight of the substrate. The heating temperature for drying to obtain the prepreg may be appropriately selected depending on the solvent, but will generally be 50–200° C., and preferably 50–150° C.

The thickness of the metal foil used to produce such a film laminate is usually 5–75 μm and preferably 8–50 μm, while the thickness of the resin layer made of the polyimide-based composite or its precursor is usually 1–150 μm and preferably 5–100 μm.

Also, by thermally compressing a plurality of film laminates in the same manner described above, it is possible to produce a multilayer film laminate. A multilayer film laminate can also be produced by inserting the prepreg between the film laminate and the metal foil and thermally compressing it in the same manner as described above.

As materials for the metal foil in the film laminate there may be mentioned gold, silver, copper, nickel, stainless steel, aluminum, iron and various alloys. If necessary, metal foils made of multiple metal laminates or plated materials may be used.

The various reinforcing materials mentioned above may be used in the resin layer of the film laminate. Among them, organic fiber reinforcing materials (hereunder referred to as "fiber reinforcing materials") such as aromatic polyamides, polyamidoimides, polyimides, total aromatic polyesters, ultra-high molecular weight polyethylene, high-strength polyacrylonitrile and high-strength polyvinyl alcohol are preferred for used, and nonwoven fabrics made of total aromatic polyamides are especially preferred.

By using the aforementioned fiber reinforcing materials for production of the film laminate it is possible to effectively prevent flowing and forced seepage of the precursor during lamination, as well as short circuiting between the upper and lower wires. The aforementioned fiber reinforcing materials are also preferred from the aspect of their low smearing during via hole formation by laser, compared to glass fibers which have been conventionally used for reinforcement of epoxy compounds.

<Precursor film with no base>

A precursor film with no base (hereunder referred to as "precursor film (alone)") may be obtained by coating a varnish or aqueous dispersion of the invention onto a suitable substrate, if necessary subjecting it to drying and pressure, to form a film made of the precursor, and then forcefully peeling off the precursor film from the base while still uncured. This precursor film forms then film-like composite upon thermosetting, etc.

The base used here is not particularly restricted, and as examples there may be mentioned metals such as iron, nickel, stainless steel, titanium, aluminum, copper and various alloys; ceramics such as silicon nitride, silicon carbide, sialon, aluminum nitride, boron nitride, boron carbide, zirconium oxide, titanium oxide, alumina, silica and mixtures thereof; semiconductors such as Si, Ge, SiC, SiGe and GeAs; ceramic materials such as glass and porcelain; and heat-resistant resins such as aromatic polyamides, polyamidoimides, polyimides and total aromatic polyesters.

If desired, the base may be subjected to release treatment by preformation of a releasable layer on its surface, or it may be subjected to appropriate pretreatment involving chemical treatment with a silane coupling agent, titanium coupling agent, etc., or with plasma treatment, ion plating, sputtering, gas-phase reaction, vacuum vapor deposition or the like.

For coating of the base with the varnish or aqueous dispersion of the invention, an appropriate coating means may be employed, such as spin coating, roll coating, flow coating, immersion coating, spray coating, electrodeposition coating or the like. The coating thickness can be appropriately controlled by selecting the coating means or by adjusting the solid portion concentration and viscosity of the varnish or aqueous dispersion, the electrodeposition conditions, etc.

As a preferred method of producing the precursor film (alone) there may be mentioned a method whereby a polyimide-based aqueous dispersion according to the invention is used as an electrodeposition solution for electrodeposition of particles of the precursor onto a releasable layer to form a precursor film, and then releasing the precursor film from this layer. The "releasable layer" is preferably a conductive layer containing releasable fine particles comprising either or both inorganic fine particles and fluorine-containing organic fine particles. The conductive layer may be formed by a non-electrolytic plating process using, for example, a plating solution containing nickel and polytetrafluoroethylene as the releasable fine particles.

As another preferred method of producing the precursor film (alone) there may be mentioned a method whereby a conductive layer-attached drum, prepared by forming a conductive layer containing the above-mentioned releasable fine particles (releasable layer) on the outer perimeter of a drum-shaped substrate made of a conductive material, has a portion of its circumference immersed in a polyimide-based aqueous dispersion of the invention and is rotated around its axial center while electrodepositing particles of the precursor on the conductive layer-attached drum to continuously form a precursor film, and the formed precursor film is dried and then released in a continuous manner from the conductive layer.

A patterned precursor film (alone) can be obtained by covering sections of the surface of the structure made of the conductive material with a non-conductive pattern, then prepare a conductive layer-attached base by forming a conductive layer containing the above-mentioned releasable fine particles (releasable layer) on the other sections of the surface of the base, and then electrodepositing the precursor particles in a polyimide-based aqueous dispersion of the invention onto the conductive layer-attached base, to form a precursor film, after which the precursor film is released from the conductive layer. Further heat treatment of the precursor film will form a patterned film-like composite.

The precursor film (alone) obtained in this manner can be suitably utilized for production of the aforementioned film laminate. Specifically, the precursor film (alone) is attached onto the metal foil using a conventionally known method such as hot pressing, rolling, etc., to obtain a film laminate formed by lamination of a resin layer made of a polyimide-based composite of the invention or its precursor, and a metal foil. This film laminate can be used as a metal-clad laminate for a circuit board.

The precursor film and the film-like composite formed from the film can be suitably used as materials for construction of electronic parts such as insulating protective layers, insulating adhesives, stress relaxation layers, chip packages and the like In semiconductor devices.

<Electronic parts>

The resin layer made of a polyimide-based composite according to the invention has excellent adhesion with various materials while also possessing the original excellent insulating properties of the polyimide, and it is therefore suitable as a resin layer for construction of electronic parts.

Also, since the film-like composite and precursor film can be easily adhered to the metal layer and resin layer by thermal compression, it is possible to use at least one layer of the film-like composite or precursor film, laminated with a plurality of layers of film-like composites either commercially available or according to the invention, for the structural sections of electronic parts.

Such electrical parts can be manufactured using publicly known methods. For example, for manufacture of a multilayer printed wiring board, the following steps (1) to (5) may be employed:

(1) A step of multilayer adhesion of a film laminate with a resin layer made of a polyimide-based composite of the invention or its precursor, and an inner layer wiring board, by press molding.

(2) A step of removing the copper foil of the laminate at locations of electrical connection with the inner layer circuit, with a copper etching solution.

(3) A step of using a solvent, laser or mechanical cutting technique for etching of the exposed resin layer until the inner layer circuit is exposed, to form inner via holes.

(4) A step of electrically connecting the outer layer and inner layer circuit through the via holes with a plating or conductive paste.

(5) A step of etching the outer layer conductor with a copper etching solution to form wiring.

If necessary, the above steps (1) to (5) may be repeated to manufacture the desired multilayer printed wiring board.

When the film laminate is used to manufacture a multilayer printed wiring board, the temperature for the multilayer adhesion in step (1) is usually 150–300° C., and the adhesion pressure 1–10 MPa. A laser or mechanical cutting technique may be used to form the inner via holes in step (3), but laser cutting with $CO_2$ or excimer is particularly preferred.

The total thickness of the insulating adhesive layer of a multilayer wiring board employing a polyimide-based composite according to the invention (resin layer made of the polyimide composite) is normally 10–150 μm, and preferably 15–100 μm.

<Grinding plate>

Since the polyimide-based composite of the invention possesses the original excellent mechanical durability and chemical durability (chemical resistance, etc.) of a polyimide while also having satisfactory adhesion to substrates, it can be suitably used as an abrasive grain-anchoring or surface protective layer for a grinding plate.

When the polyimide-based composite is used for anchoring of abrasive grains, for example, an electrodeposition solution comprising a polyimide-based aqueous dispersion according to the invention and abrasive grains is used for codeposition of the precursor and abrasive grains on a metal plate by electrodeposition, and then heat treatment is effected to form a polyimide-based composite from the electrodeposited precursor.

When the polyimide-based composite of the invention is used as a surface protective layer for a grinding plate, for example, a polyimide-based aqueous dispersion according to the invention may be used as an electrodeposition solution for electrodeposition of the precursor on a grinding plate wherein non-conductive abrasive grains are anchored in a metal, and then the precursor may be heat treated to form a polyimide-based composite. According to this method it is possible to form a protective layer made of the polyimide-based composite only on the metal sections, without covering the abrasive grits. Such a surface protective layer can protect the metal sections of the grinding plate from corrosion by chemicals such as slurry.

<Surface treatment solution>

A polyimide-based aqueous dispersion according to the invention can be suitably used as a surface treatment solution by including at least one type of fine particles (releasable fine particles) selected from among inorganic fine particles, fluorine-containing fine particles and crosslinked organic fine particles. Such a surface treatment solution can be employed for surface treatment to form a coating with slidability, abrasion resistance, lubricating properties, water repellency, releasability, non-conductivity, chemical resistance, etc., regardless of the shape of the surface of the material to be treated. The coating has excellent adhesion for materials to be treated while also having the original excellent mechanical durability and chemical durability of the polyimide. Electrodeposition is preferred as the method of surface treatment.

The inorganic fine particles are not particularly restricted, but preferably have a hardness of 2 or greater (more preferably 3 or greater, and even more preferably 4 or greater). As examples of inorganic fine particles there may be mentioned fine particles of one or more types selected from among alumina. silica, silicon carbide, graphite, graphite fluoride and boron nitride, and those comprising substances generally known as solid lubricants are preferred. Silicon carbide and silica are particularly preferred.

The fluorine-containing organic fine particles are not particularly restricted so long as they can impart properties such as slidability and lubrication. As examples of fluorine-containing organic fine particles there may be mentioned fine particles of one or more types selected from among polytetrafluoroethylene (PTFE), tetrafluoroethylene-hexafluoropropylene copolymer (FEP) and tetrafluoroethylene-perfluoroalkylvlnyl ether (PFA). These fluorine-containing organic fine particles may be crosslinked or non-crosslinked.

The crosslinked organic fine particles (other than fluorine-containing organic fine particles) are not particularly restricted and for example there may be mentioned fine particles comprising a simple polymer of a crosslinkable monomer such as benzoguanamine or divinylbenzene (hereunder referred to as "monomer (a)") or a copolymer of monomer (a) and another monomer copolymerizable with monomer (a) (hereunder referred to as "monomer (b)").

A preferred proportion for using monomer (a) and monomer (b) is monomer (a) (wt %)/monomer (b) (wt %)=5–100/0–95, a more preferred proportion is 20–100/0–80, and an even more preferred proportion is 40–100/0–60.

As preferred examples for monomer (b) there may be mentioned aromatic vinyl compounds such as styrene and α-methylstyrene, (meth)acrylic acid esters such as methyl methacrylate, etc.

The mean particle size for these inorganic fine particles, fluorine-containing organic fine particles and crosslinked organic fine particles is not particularly restricted, but it is normally 0.01–100 μm, preferably 0.01–30 μm, and more preferably 0.05–10 μm.

Electrodeposition is preferred as the method of treating the surface of the material to be treated with the surface treatment solution, and specifically, the material to be treated may be immersed in the surface treatment solution and used as an electrode for flow of current against a disposed counter electrode. This results in coprecipitation of the precursor particles and releasable particles on the surface to the material to be treated, forming a composite electrodeposition coating. The composite electrodeposition coating is preferably heat treated to harden the precursor, thus forming a coating that comprises the polyimide-based composite and releasable fine particles so that a surface treatment effect is exhibited by the coating.

The precursor particles preferably have a charge on their surface in order to allow electrodeposition. The surface charge may be anionic or cationic, but cationic particles are preferred because electrodeposition with the material to be treated as the cathode can prevent elution of the metal from the material to be treated.

The amount of coprecipitation of the releasable fine particles during coprecipitation of the precursor particles and releasable fine particles is not particularly restricted, but is preferably 5–70 wt %, and more preferably 10–50 wt %. When the amount of coprecipitation of the releasable fine particles is less than 5 wt % it is sometimes impossible to obtain satisfactory slidability and lubrication properties. On the other hand, when the amount of coprecipitation of the releasable fine particles is greater than 70 wt %, the strength of the composite electrodeposition film will sometimes be inadequate, leading to such phenomena as peel-off of the coating.

EXAMPLES

The present invention will now be explained in greater detail by way of the following examples. Unless otherwise specified, the "parts" and "%" are based on weight.

The measurements and evaluations in the examples and comparative examples were carried out in the following manner.

(I) Evaluation of aqueous dispersions
 (i) Mean particle size
 The aqueous dispersion was diluted with distilled water to a solid portion concentration of 0.01 wt % and measured using an LPA3000 dynamic light scattering meter (manufactured by Otsuka Denshi, KK.).
 (ii) Dispersion stability I
 One drop of the freshly prepared aqueous dispersion was dropped on a glass panel and the presence of any aggregation was visually observed and evaluated based on the following scale.
  ○—no aggregation
  △—presence of local aggregation
  X—completely aggregated
 (iii) Dispersion stability II
 The aqueous dispersion was poured into a plastic bottle and the dispersion state and viscosity were visually observed after storage at 40° C. for 30 days, and evaluated based on the following scale.
  ○—no change
  △—no separation into two layers, but rather high viscosity
  X—separation into two layers (II) Formation and property evaluation of thermosetting films and cured films
 The varnish or aqueous dispersion was used to form a thin film by the following coating method, and the properties mentioned below were evaluated.
 (i) Film formation method
 After using a spinner for spin coating of the varnish or aqueous dispersion on a previously release-treated glass panel to form a thermosetting film, it was heated at 250° C. for 30 minutes for curing to obtain a cured film. Next, the thermosetting film and cured film were forcibly released from the panel to obtain a 55 μm thick thermosetting film (alone) and a 50 μm thick cured film (alone). The obtained thermosetting film and cured film were evaluated by the following methods.

(ii) Property evaluation method
 (1) Elastic modulus
 The cured film was measured using a DMTA (manufactured by Polymer Laboratories).
 (2) Tensile strength
 The cured film was measured according to JIS K6911 or JIS C2318.
 (3) 10% weight reduction temperature
 The cured film was measured using a thermogravimetric analyzer (TGA), in air at a temperature elevating rate of 10° C./min.
 (4) Transparency
 The cured film was visually examined and evaluated on the following scale.
  ○—transparent
  X—cloudiness present
 (5) HAST test (moist heat resistance)
 The cured film was subjected to a 72-hour moist heat resistance test under conditions of 121° C., 100% humidity and 2 atmospheres, and the moist heat resistance was evaluated on the following scale based on the degree of change according to infrared spectroscopy before and after the test.
  ○—no change, excellent resistance
  X—large change, low resistance
 (6) Volume resistivity and surface resistivity
 The cured film was measured according to JIS K6911.
 (7) Copper foil peel strength
 The thermosetting film was sandwiched between a 130 μm thick polyimide film (trade name: Captone, manufactured by Toray-DuPont) and a 0.5-mm thick copper plate, and a load of 100 g/cm$^2$ was applied with heating at 250° C. for 30 minutes. The peel strength from the copper side of the polyimide film was then measured according to JIS H8630 and JIS C6481, using a bond strength tester (manufactured by Yamamoto Plating Testers, KK.)
 (8) Water absorption
 A piece of cured film with an area of 5 cm×5 cm was allowed to stand in demineralized water at 25° C., and the water absorption (wt %) after 24 hours was measured.
 (9) Soldering heat resistance
 This was measured according to JIS C6481. The measurement was conducted before HAST and after HAST.
 The glass transition temperature of component (B) was measured according to the ASTM method, using a differential scanning calorimeter (DSC: manufactured by DuPont).

(III) Evaluation of insulating protective film
 (1) Surface resistivity and volume resistivity
 Both were measured according to JIS K6911.
 (2) Pencil hardness
 This was measured according to JIS K5400.
 (3) HAST test (moist heat resistance)
 The measurement and evaluation were conducted according to (ii) (5) above.

(IV) Evaluation of surface treatment solution
 (1) Pencil hardness
 This was measured according to JIS K5400.
 (2) Friction coefficient and abrasion loss
 The friction coefficient and abrasion loss (mg/cm$^2$) were measured under the following test conditions.
  Load: 50 N/cm$^2$
  Speed: 1 m/min Opposing material: SUS304

Reciprocating fluctuation test: 200 mm stroke

Test cycle: $100 \times 10^4$ (400 km)

(3) Chemical resistance

The surface-treated copper plate was immersed for 24 hours at normal temperature in a 5 wt % aqueous hydrochloric acid solution, a 5 wt % aqueous sulfuric acid solution, a 20 wt % aqueous phosphoric acid solution, a 10 wt % aqueous nitric acid solution and a 5 wt % aqueous sodium hydroxide solution, and the condition of the surface coating was visually examined to determine the chemical resistance. The evaluation results are represented by the following 2-level scale.

○—no abnormality in coating

X—corrosion over entire surface

Synthesis of Polyimide Component (A)

Synthesis Example 1

In 450 g of N-methyl-2-pyrrolidone there were dissolved 35.88 g (100 mmol) of 3,3',4,4'-diphenylsulfone tetracarboxylic dianhydride as a tetracarboxylic dianhydride and 36.95 g (90 mmol) of 2,2-bis[4-(4-aminophenoxy)phenyl] propane as a diamine compound, with 1.25 g (5 mmol) of the organosiloxane X22-161-AS (trade name, manufactured by Shinetsu Kagaku) corresponding to formula (10) and 0.78 g (5 mmol) of diaminobenzoic acid, and reaction was conducted at room temperature for 12 hours. To this reaction solution there were then added 40 g of pyridine and 100 g of acetic anhydride, and dehydrating ring closure reaction was conducted at 100° C. for 3 hours. Next, the reaction solution was distilled under reduced pressure for purification to obtain a 10% solid solution of polyimide (A1) with an inherent viscosity of 0.51 dl/g.

Synthesis Example 2

In 500 g of N-methyl-2-pyrrolidone there were dissolved 35.88 g (100 mmol) of 3,3',4,4'-diphenylsulfone tetracarboxylic dianhydride as a tetracarboxylic dianhydride, 32.84 g (80 mmol) of 2,2-bis[4-(4-aminophenoxy)phenyl] propane and 1.98 g (10 mmol) of 4,4'-diaminodiphenylmethane as diamine compounds and 9.00 g (10 mmol) of the organosiloxane X22-161-AS (trade name, manufactured by Shinetsu Kagaku) corresponding to formula (10), and reaction was conducted at room temperature for 12 hours. To this reaction solution there were then added 32 g of pyridine and 71 g of acetic anhydride, and dehydrating ring closure reaction was conducted at 100° C. for 3 hours. Next, the reaction solution was distilled under reduced pressure for purification to obtain a 10% solid solution of polyimide (A2) containing 5% polyamic acid, with an inherent viscosity of 0.45 dl/g and an imidation rate of 95%.

Synthesis Example 3

In 500 g of N-methyl-2-pyrrolidone there were dissolved 17.94 g (50 mmol) of 3,3',4,4'-diphenylsulfone tetracarboxylic dianhydride and 22.23 g (50 mmol) of 4,4'-[2,2,2-trifluoromethyl-1-(trifluoromethyl)ethylidene] bis(1,2-benzenedicarboxylic anhydride) as tetracarboxylic dianhydrides, 32.84 g (80 mmol) of 2,2-bis[4-(4-aminophenoxy)phenyl] propane as a diamine compound, 1.52 g (10 mmol) of diaminobenzoic acid and 9.00 g (10 mmol) of the organosiloxane X22-161-AS (trade name, manufactured by Shinetsu Kagaku) corresponding to formula (10), and reaction was conducted at room temperature for 12 hours. To this reaction solution there were then added 20 g of pyridine and 30 g of acetic anhydride, and dehydrating ring closure reaction was conducted at 100° C. for 3 hours. Next, the reaction solution was distilled under reduced pressure for purification to obtain a 10% solid solution of polyimide (A3) with an inherent viscosity of 0.53 dl/g and an imidation rate of 100%.

Synthesis of Other Polymer Component (B))

Synthesis Example 4

A reaction vessel containing 100 parts of γ-butyrolactone was held in a nitrogen gas atmosphere at 85° C., and then a mixed solution comprising 70 parts of n-butyl acrylate, 10 parts of ethyl acrylate, 10 parts of dimethylaminoethyl acrylate, 10 parts of glycidyl methacrylate and 1 part of azobisisobutyronitrile was continuously added to the reaction vessel over a period of 5 hours during solution polymerization while stirring. After completion of the dropwise addition, stirring was continued for an additional 2 hours at 85° C. to complete the solution polymerization, thus obtaining a 50% solid solution of a cationic acryl polymer (B1).

Synthesis Example 5

A reaction vessel containing 100 parts of γ-butyrolactone was held in a nitrogen gas atmosphere at 85° C., and then a mixed solution comprising 80 parts of n-butyl acrylate, 15 parts of dimethylaminopropylacrylamide, 5 parts of isocyanate ethyl methacrylate and 1 part of azobisisobutyronitrile was continuously added to the reaction vessel over a period of 5 hours during solution polymerization while stirring. After completion of the dropwise addition, stirring was continued for an additional 2 hours at 85° C. to complete the solution polymerization, thus obtaining a 50% solid solution of a cationic acryl polymer (B2).

Synthesis Example 6

A reaction vessel containing 100 parts of N-methylpyrrolidone was held in a nitrogen gas atmosphere at 85° C., and then a mixed solution comprising 55 parts of 2-ethylhexyl acrylate, 5 parts of methyl methacrylate, 30 parts of dimethylaminopropylacrylamide, 5 parts of glycidyl methacrylate, 5 parts of hydroxyethyl acrylate and 1 part of azobisisobutyronitrile was continuously added to the reaction vessel over a period of 5 hours during solution polymerization while stirring. After completion of the dropwise addition, stirring was continued for an additional 2 hours at 85° C. to complete the solution polymerization, thus obtaining a 50% solid solution of a cationic acryl polymer (B3).

The following Examples 1–6 are examples wherein precursor varnishes or polyimide-based aqueous dispersions were prepared, and polyimide-based composites according to the invention were formed from these varnishes and aqueous dispersions.

Example 1

To 30 parts (solid portion) of a solution of polyimide (A1) as component (A) there were added 40 parts (solid portion) of a solution of acryl polymer (B1) as component (B) and 30 parts (solid portion) of Epikote YL980 (trade name, manufactured by Yuka Shell Epoxy) as a crosslinking agent, and the mixture was heated at 80° C. for 4 hours to obtain a varnish in which a polyimide-based composite precursor was dissolved. A cured film was fabricated from this varnish by the method of (II)(i) above, and the performance was evaluated by the method of (II)(ii) above. The evaluation results are shown in Table 1.

Example 2

To 30 parts (solid portion) of a solution of polyimide (A1) as component (A) there were added 40 parts (solid portion) of a solution of acryl polymer (B1) as component (B) and 30 parts (solid portion) of Epikote YL980 (trade name, manufactured by Yuka Shell Epoxy) as a crosslinking agent, and after heating the mixture at 80° C. for 4 hours, 5 parts of terephthalic acid was slowly added and mixed therewith as a pH adjuster to obtain a varnish in which a polyimide-based composite precursor was dissolved. The varnish was slowly added to 1000 parts of ion exchange water, and vigorous mixing gave a polyimide-based aqueous dispersion with no aggregation. The aqueous dispersion was evaluated according to (I) above. A cured film was fabricated by the method of (II)(i) above, and the performance was evaluated by the method of (II)(ii) above. The evaluation results are shown in Table 1.

Examples 3–6

Polyimide-based aqueous dispersions with no aggregation were obtained in the same manner as Example 2, except that the compounds listed in Table 1 were used as component (A) and component (B). These aqueous dispersions were evaluated in the same manner as Example 1. Cured films were also fabricated by the above-mentioned method and their performance was evaluated in the same manner as Example 1. The evaluation results are shown in Table 1.

Comparative Example 1

A varnish was prepared and a cured film fabricated and evaluated in the same manner as Example 1, except that only a solution of polyimide (A1) was used and no solution of acryl polymer (B1) was used. The evaluation results are shown in Table 2.

Comparative Example 2

An aqueous dispersion was prepared and a cured film fabricated and evaluated in the same manner as Example 3, except that only a solution of polyimide (A3) was used and no solution of acryl polymer (B3) was used. The evaluation results are shown in Table 2.

The structures of the cured films of Examples 1–6 and Comparative Examples 1 and 2 were confirmed by electron micrographs taken in the manner shown in FIG. 1. The results are summarized in Tables 1 and 2. Here, the films with a continuous phase of the polyimide and a discontinuous phase of the other polymer were indicated with the symbol "○". The electron micrographs were also subjected to image analysis to measure the number-mean particle size of the discontinuous phase. Films wherein such a structure was not formed were indicated with the symbol "X".

TABLE 1

|  | Example 1 | Example 2 | Example 3 | Example 4 | Example 5 | Example 6 |
|---|---|---|---|---|---|---|
| Component (A) | A1 | A1 | A2 | A3 | A1 | A3 |
| Reactive group (a) | —COOH amic acid | —COOH amic acid | amic acid | —COOH | —COOH amic acid | —COOH |
| Parts (solid portion) | 30 | 30 | 30 | 30 | 40 | 40 |
| Component (B) | B1 | B1 | B2 | B3 | B1 | B3 |
| Reactive group (b) | epoxy | epoxy | —NCO | epoxy hydroxyl | epoxy | epoxy hydroxyl |
| Tg (° C.) | −40 | −40 | −20 | −20 | −40 | −20 |
| Elastic modulus | 0.01 | 0.01 | 0.005 | 0.002 | 0.01 | 0.002 |
| Parts (solid portion) | 40 | 40 | 40 | 40 | 30 | 40 |
| Crosslinking agent |  |  |  |  |  |  |
| Parts (solid portion) | 30 | 30 | 30 | 30 | 30 | 20 |
| Solution form | varnish | aqueous dispersion | aqueous dispersion | aqueous dispersion | aqueous dispersion | aqueous dispersion |
| Mean particle size (μm) | — | 0.3 | 0.3 | 0.2 | 0.5 | 0.2 |
| Dispersion stability I | — | ○ | ○ | ○ | ○ | ○ |
| Dispersion stability II | — | ○ | ○ | ○ | ○ | ○ |
| Structure of cured product | ○ | ○ | ○ | ○ | ○ | ○ |
| Mean particle size (μm) | 0.5 | 0.2 | 0.2 | 0.1 | 0.3 | 0.2 |
| Elastic modulus (GPa) | 0.6 | 0.5 | 0.7 | 0.7 | 0.9 | 0.3 |
| Tensile strength (kgf/cm$^2$) | 800 | 800 | 900 | 900 | 1000 | 800 |
| 10% weight reduction temperature (° C.) | 350 | 350 | 350 | 350 | 350 | 350 |
| Transparency | ○ | ○ | ○ | ○ | ○ | ○ |
| Moist heat resistance | ○ | ○ | ○ | ○ | ○ | ○ |
| Volume resistivity (Ω · cm) | $10^{17}$ | $10^{17}$ | $10^{17}$ | $10^{17}$ | $10^{17}$ | $10^{17}$ |
| Surface resistivity (Ω) | $\geq 10^{16}$ | $\geq 10^{16}$ | $\geq 10^{16}$ | $\geq 10^{16}$ | $\geq 10^{16}$ | $\geq 10^{16}$ |
| Copper foil peeling (kgf/cm) | 0.8 | 0.9 | 0.8 | 0.9 | 0.8 | 0.9 |
| Water absorption (%) | 0.2 | 0.3 | 0.1 | 0.2 | 0.3 | 0.2 |
| Soldering heat resistance |  |  |  |  |  |  |
| Before HAST | ○ | ○ | ○ | ○ | ○ | ○ |
| After HAST | ○ | ○ | ○ | ○ | ○ | ○ |

TABLE 2

|  | Comparative Example 1 | Comparative Example 2 |
|---|---|---|
| Component (A) | A1 | A2 |
| Reactive group (a) | —COOH | amic acid |

TABLE 2-continued

|  | Comparative Example 1 | Comparative Example 2 |
|---|---|---|
|  | amic acid |  |
| Parts (solid portion) | 70 | 70 |
| Component (B) |  |  |
| Reactive group (b) |  |  |
| Tg (° C.) |  |  |
| Elastic modulus |  |  |
| Parts (solid portion) | 0 | 0 |
| Crosslinking agent |  |  |
| Parts (solid portion) | 30 | 30 |
| Solution form | varnish | aqueous dispersion |
| Mean particle size ($\mu$m) | — | 6.0 |
| Dispersion stability I | — | X |
| Dispersion stability II | — | X |
| Structure of cured product | X | X |
| Mean particle size ($\mu$m) | — | — |
| Elastic modulus (GPa) | 8.0 | 7.0 |
| Tensile strength (kgf/cm$^2$) | 900 | 900 |
| 10% weight reduction temperature (° C.) | 400 | 400 |
| Transparency | ○ | ○ |
| Moist heat resistance | X | X |
| Volume resistivity ($\Omega$·cm) | $10^{16}$ | $10^{16}$ |
| Surface resistivity ($\Omega$) | $\geq 10^{16}$ | $\geq 10^{16}$ |
| Copper foil peeling (kgf/cm) | 0.1 | 0.1 |
| Water absorption (%) | 2.0 | 2.6 |
| Soldering heat resistance |  |  |
| Before HAST | ○ | ○ |
| Ater HAST | ○ | ○ |

As clearly shown in Tables 1 and 2, in comparison with Comparative Examples 1 and 2 [corresponding to conventional polyimide resins in which component (B) was not used], the cured films of Examples 1–6 comprising polyimide-based composites according to the invention all had elastic moduli of 1 GPa or lower, which were clearly lower than the conventional polyimide resins, but still maintained the original satisfactory properties of the polyimides, including electrical insulating properties, strength, heat resistance, etc. The adhesion to copper foil and the moist heat resistance were also high, while the water absorption was minimal.

The polyimide-based aqueous dispersions of the invention prepared in Examples 2–6 also had much better dispersion stability than the conventional aqueous dispersion of Comparative Example 1.

Example 7

Example 7 is a case where a precursor film was fabricated by electrodeposition using a polyimide-based aqueous dispersion according to the invention, and the precursor film was used to form an insulating protective layer comprising a polyimide composite according to the invention.

(1) Formation of non-conductive pattern

A stainless steel plate (SUS304) as the base was coated with a resist resin (trade name "OPTMER NN550", manufactured by JSR, KK.) to a thickness of 5 $\mu$m. This was prebaked (80° C.×5 minutes), after which a photomask (L/S=30/70 $\mu$m) was used for light exposure at an exposure of 100 mJ, and a standard developing solution was used for development. It was then postbaked (250° C.×30 minutes) to obtain a base coated with a non-conductive pattern.

(2) Composite plating

The base obtained in step (1) above was immersed in a nickel-phosphorus-PTFE composite plating solution (trade name "Nimufuron", manufactured by Uemura Industries, KK.) for plating by a non-electrolytic plating method at a solution temperature of 90° C., thus forming a 7 $\mu$m thick nickel-phosphorus-PTFE composite plating layer on the sections of the base surface that were not coated with the aforementioned non-conductive pattern.

(3) Electrodeposition

An electrodeposition solution comprising the polyimide-based aqueous dispersion prepared in Example 2 was poured into a 2-liter glass container, and using the composite plating layer-attached base obtained in step (2) above as the cathode and a counter electrode as the anode, electrodeposition was carried out for 2 minutes while stirring, at a temperature of 25° C., an electrode distance of 4 cm and a voltage of 50 V. The precursor that was electrodeposited on the cathode was semi-cured by drying at 80° C.×5 minutes, thus forming a 30 $\mu$m thick precursor film on the composite plating layer.

(4) Transfer

On a precision press machine with an aligner preheated to 100° C. there were placed the base with the precursor film formed thereon in step (3) above, and a transfer plate, and contact bonding at a pressure of 5 kg/cm$^2$ for 20 minutes resulted in separation of the precursor film from the composite plating layer onto the transfer plate, after which curing by heat treatment at 250° C.×10 minutes formed an insulating protective layer comprising the polyimide-based composite.

The performance of the obtained insulating protective film was evaluated by the method of (III) above. The results are shown in Table 3. The polyimide-based composite of the invention which had been formed from the polyimide-based aqueous dispersion of Example 2 exhibited excellent performance as an insulating protective layer.

TABLE 3

|  | Example 7 |
|---|---|
| Film thickness | 30 $\mu$m |
| Surface resistivity | $\geq 10^{16}$ $\Omega$ |
| Volume resistivity | $10^{17}$ $\Omega$·cm |
| Pencil hardness | H |
| HAST test | ○ |

Example 8

Example 8 is a case where a polyimide-based aqueous dispersion according to the invention was used to produce a multilayer printed circuit board.

(1) Preparation of inner layer circuit

A 0.2-mm thick double-sided copper-clad glass base epoxy resin laminate having an 18 $\mu$m thick copper foil laminated on both sides was subjected to circuit working by an etching process, and then the copper foil sides were subjected to oxidation treatment to obtain an inner layer circuit panel.

(2) Production of multilayer printed circuit board

The polyimide-based aqueous dispersion prepared in Example 2 was used as an electrodeposition solution to form a 20 $\mu$m thick resin layer (precursor film) by electrodeposition on one side of an 18 $\mu$m thick copper foil, to obtain a film laminate. One film laminate was disposed on each of both sides of the aforementioned inner layer circuit panel with the resin layers contacting them, and this was subjected to thermal compression at 80° C, 2 MPa pressure for 10 minutes, after which the temperature was increased to 200°

C. and the pressure to 4 MPa for further thermal compression for 30 minutes to harden the precursor, thus obtaining a 4-layer printed wiring board provided with a resin layer made of a polyimide-based composite according to the invention.

(3) Performance evaluation

The obtained 4-layer printed wiring board was examined for its outer appearance after copper foil etching, the presence or absence of voids in the inner layer irregularities, adhesive strength between the inner layer circuit panel and the laminate, and electric corrosion resistance. The results are shown in Table 4. Here, the adhesive strength was measured by the method of (II)(ii)(7) described above. The electric corrosion resistance was represented by the time required for the insulating resistance to reach $10^8$ Ω or below upon continuous application of DC 50 V between the two electrodes at a clearance of 0.55 mm, at 85° C., 85% RH. The polyimide-based composite of the invention formed from the polyimide-based aqueous dispersion of Example 2 was suitable as a resin for multilayer printed wiring boards.

TABLE 4

|  | Example 8 |
|---|---|
| Component (A) | A1 |
| Parts (solid portion) | 30 |
| Component (B) | B1 |
| Parts (solid portion) | 40 |
| Crosslinking agent |  |
| Parts (solid portion) | 30 |
| Evaluation results |  |
| Appearance after etching | No Voids |
| adhesive strength (N/cm) | 18 |
| Electric corrosion resistence | ≧1000 hours |

Example 9

Example 9 is a case where a grinding plate was produced using a polyimide-based aqueous dispersion according to the invention.

An electrodeposition solution containing the polyimide-based aqueous dispersion prepared in Example 2 and alumina particles (mean particle size: 0.2 μm) as abrasive grains was used for coprecipitation of the alumina particles and precursor particles on the SUS plate on the cathode end by the constant voltage method. The electrodeposited precursor was then cured by heating at 100° C. for 10 minutes and then at 250° C. for 30 minutes, to obtain a grinding plate having alumina grains anchored in the SUS plate with the polyimide-based composite. The thickness of the polyimide-based composite layer was 20 μm, and the amount of coprecipitation of the alumina grains was 50%.

The resulting grinding plate was used to evaluate the polishing speed under the following conditions. The results are shown in Table 5. The polyimide-based composite of the invention formed from the polyimide-based aqueous dispersion of Example 2 was suitable as a resin for anchoring of abrasive grains in grinding plates.

Polishing Speed

Polishing target: 125 mm×125 mm quartz glass panel preworked with #2000 diamond pellets Polishing pressure: 120 g/cm²
Rotation speed: 25 rpm
Polishing time: 10 minutes

TABLE 5

|  | Example 9 |
|---|---|
| Polishing speed (μm/min) on quartz glass | 2.0 |

Example 10

Example 10 is a case where a polyimide-based aqueous dispersion of the invention was used as a surface treatment agent.

To the polyimide-based aqueous dispersion prepared in Example 2 there were added PTFE particles with a size of 0.3 μm as releasable fine particles, in an amount such that the weight ratio of the fine particles of the total weight of the solid portion of the polyimide-based aqueous dispersion and the fine particles was 25%, to prepare a surface treatment solution. A copper plate washed with dilute acid was used as the material to be treated, and the copper plate was immersed in the surface treatment solution to cause coprecipitation of the precursor particles and PTFE particles on the copper plate at the cathode end by the constant voltage method. The electrodeposited precursor was heated at 100° C. for 10 minutes and then at 250° C. for 30 minutes to form a polyimide-based composite, to accomplish surface treatment which formed a composite electrodeposition coating with a thickness of 20 μm and 20% coprecipitation of PTFE on the copper plate.

The performance of the resulting composite electrodeposition coating was evaluated by the method of (III) described above. The results are shown in Table 6. The surface treatment using the polyimide-based aqueous dispersion of Example 2 allowed formation of a coating with excellent abrasion resistance and chemical resistance, a low friction coefficient and high hardness on the surface of the substrate.

TABLE 6

|  | Example 10 |
|---|---|
| Fine particle material | PTFE |
| Component (A) | A1 |
| Parts (solid portion) | 30 |
| Component (B) | B1 |
| Parts (solid portion) | 40 |
| Pencil hardness | H |
| Friction coefficient | 0.2 |
| Abrasion loss (mg/cm²) | 0.01 |
| Chemical resistance |  |
| Hydrochloric acid | ○ |
| Sulfuric acid | ○ |
| Phosphoric acid | ○ |
| Nitric acid | ○ |
| Sodium hydroxide | ○ |

What is claimed is:

1. A polyimide-based composite formed using a precursor comprising (A) a polyimide component and (B) another polymer component,
the polyimide-based composite being characterized in that in the composite the polyimide forms a continuous phase and the other polymer forms a discontinuous phase, and the elastic modulus of the composite is less than 10 GPa.

2. A polyimide-based composite according to claim 1, wherein the number-mean particle size of said discontinuous phase is in the range of 0.01–0.9 μm.

3. A polyimide-based composite according to claim 1 above, wherein the glass transition temperature of said other polymer is in the range of −200° C. to 120° C.

4. A polyimide-based composite according to claim 1, wherein the amount of said (A) polyimide component used is at least 5 wt % and less than 50 wt % with respect to the total amount of said polyimide-based composite.

5. A polyimide-based composite according to claim 1, wherein said (A) polyimide component is at least one type selected from among polyimide-based polymers and polyamic acid, said (B) other polymer component comprises an elastic polymer with a reactive group and an elastic modulus of 0.0001–0.5 GPa, and said precursor is obtained by reacting said (A) polyimide component and said (B) other polymer component.

6. A polyimide-based composite according to claim 1, which is formed using a polyimide-based aqueous dispersion obtained by dispersing said precursor in particle form in an aqueous medium.

7. A polyimide-based composite according to claim 1, which is formed using an organic solvent solution of said precursor.

8. A polyimide-based composite according to claim 1, wherein said (B) other polymer component is (B-1) a cationic polymer component, and which is formed using a polyimide-based aqueous dispersion obtained by dispersing said precursor in particle form in an aqueous medium in the presence of a polyacid.

9. A polyimide-based composite according to claim 1, wherein said (B) other polymer component is (B-2) an anionic polymer component, and which is formed using a polyimide-based aqueous dispersion obtained by dispersing said precursor in particle form in an aqueous medium in the presence of a polyamine.

10. A polyimide-based composite according to claim 1 which forms a film.

11. A polyimide-based composite according to claim 10, which is formed by electrodeposition of said precursor.

12. An electronic part having a resin layer comprising a polyimide-based composite according to claim 1.

13. A polyimide-based aqueous dispersion prepared by dispersing in particle form in an aqueous medium a precursor which forms a polyimide-based composite, the polyimide-based aqueous dispersion being characterized in that the particles of said precursor include in the same particles (A) a polyimide component and (B) another polymer component composed of a hydrophilic polymer, and have a mean particle size of 0.03–5 μm.

14. A polyimide-based aqueous dispersion according to claim 13, wherein said (B) other polymer component is (B-1) a cationic polymer component, and the dispersion of said precursor in said aqueous medium is accomplished in the presence of a polyacid.

15. A polyimide-based aqueous dispersion according to claim 13, wherein said (B) other polymer component is (B-2) an anionic polymer component, and the dispersion of said precursor in said aqueous medium is accomplished in the presence of a polyamine.

16. A polyimide-based aqueous dispersion according to any one of claims 13 to 15 which is used in a surface treatment solution.

17. A polyimide-based aqueous dispersion according to any one of claims 13 to 15 which is used for electrodeposition.

* * * * *